(12) United States Patent
Ishimoto et al.

(10) Patent No.: US 8,149,661 B2
(45) Date of Patent: Apr. 3, 2012

(54) SHORT-PULSE LIGHT SOURCE, LASER LIGHT EMISSION METHOD, OPTICAL DEVICE, OPTICAL DISC DEVICE, AND OPTICAL PICKUP

(75) Inventors: Tsutomu Ishimoto, Tokyo (JP); Kazuhiko Fujiie, Kanagawa (JP)

(73) Assignee: Sony Corporation, Tokyo (JP)

( * ) Notice: Subject to any disclaimer, the term of this patent is extended or adjusted under 35 U.S.C. 154(b) by 48 days.

(21) Appl. No.: 12/734,735

(22) PCT Filed: Sep. 16, 2009

(86) PCT No.: PCT/JP2009/066713
§ 371 (c)(1),
(2), (4) Date: May 20, 2010

(87) PCT Pub. No.: WO2010/038681
PCT Pub. Date: Apr. 8, 2010

(65) Prior Publication Data
US 2011/0019513 A1    Jan. 27, 2011

(30) Foreign Application Priority Data
Sep. 30, 2008   (JP) .................... 2008-255022

(51) Int. Cl.
*G11B 20/10*   (2006.01)
(52) U.S. Cl. ......................... 369/47.5; 372/25
(58) Field of Classification Search ............... 369/47.5, 369/47.52, 53.26, 116
See application file for complete search history.

(56) References Cited

U.S. PATENT DOCUMENTS

| | | | | |
|---|---|---|---|---|
| 5,825,798 A | * | 10/1998 | Momiuchi et al. | 372/75 |
| 5,991,325 A | * | 11/1999 | Ohtomo et al. | 372/69 |
| 2002/0197560 A1 | * | 12/2002 | Ichihara | 430/270.13 |

FOREIGN PATENT DOCUMENTS

| | | | |
|---|---|---|---|
| JP | 10-221075 | | 8/1998 |
| JP | 2005-037658 A | | 2/2005 |
| JP | 2005037658 A | * | 2/2005 |
| JP | 2005-209988 A | | 8/2005 |
| JP | 2006-012199 A | | 1/2006 |
| JP | 2006-278926 A | | 10/2006 |
| JP | 2007-139925 A | | 5/2007 |
| JP | 2007-522594 | | 8/2007 |
| JP | 2008-071433 A | | 3/2008 |

* cited by examiner

*Primary Examiner* — Wayne Young
*Assistant Examiner* — Brenda Bernardi
(74) *Attorney, Agent, or Firm* — Wolf, Greenfield & Sacks, P.C.

(57) ABSTRACT

Directed to freely adjusting an emission period of a semiconductor laser.
In the present invention, pulsed light serving as pulse-shaped laser light (LL) is emitted from a semiconductor laser (3), and a laser drive voltage (DJ) that is generated on the basis of a pulse signal (SL) and that has pulse-shaped drive voltage pulses (DJw) is applied to the semiconductor laser (3). At this time, a short-pulse light source (51) varies a voltage period (TV) corresponding to an interval between the drive voltage pulses (DJw), thereby varying a set period (TS) corresponding to an interval between generated signal pulses (SLw) in the pulse signal (SL).

10 Claims, 29 Drawing Sheets

FIG. 14
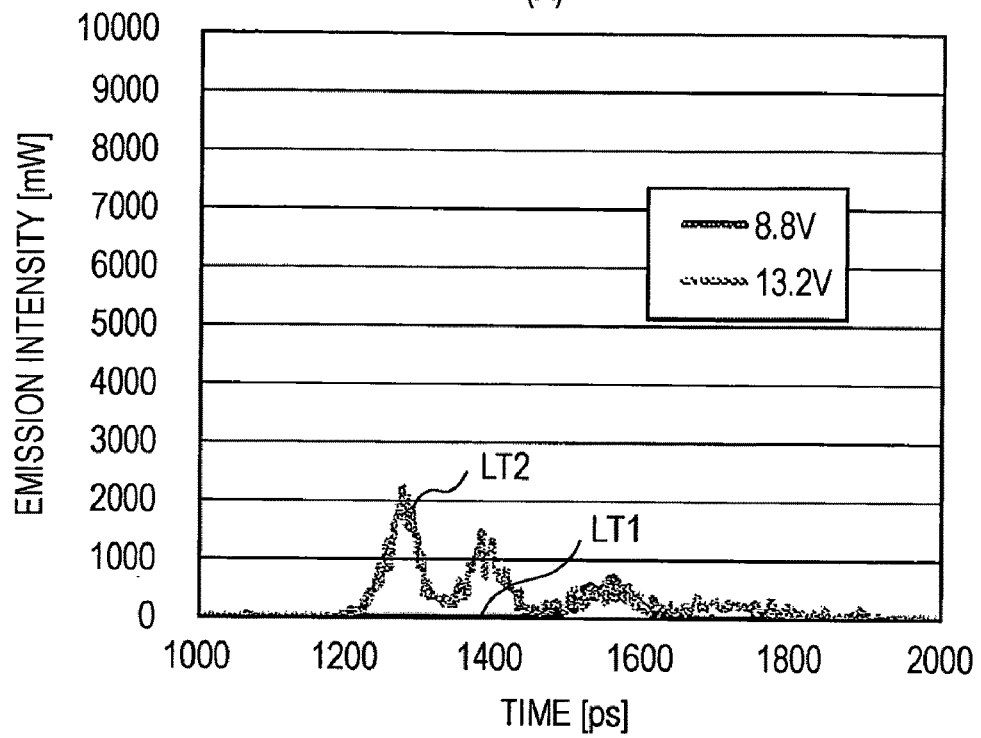
(A)
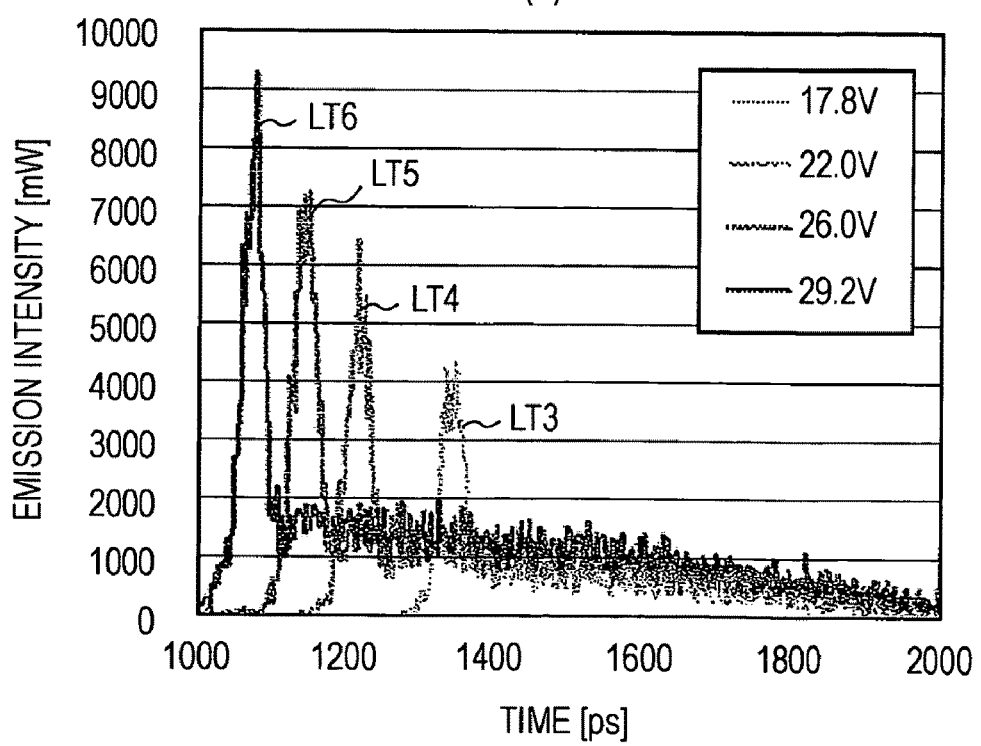
(B)

FIG. 15
(A)
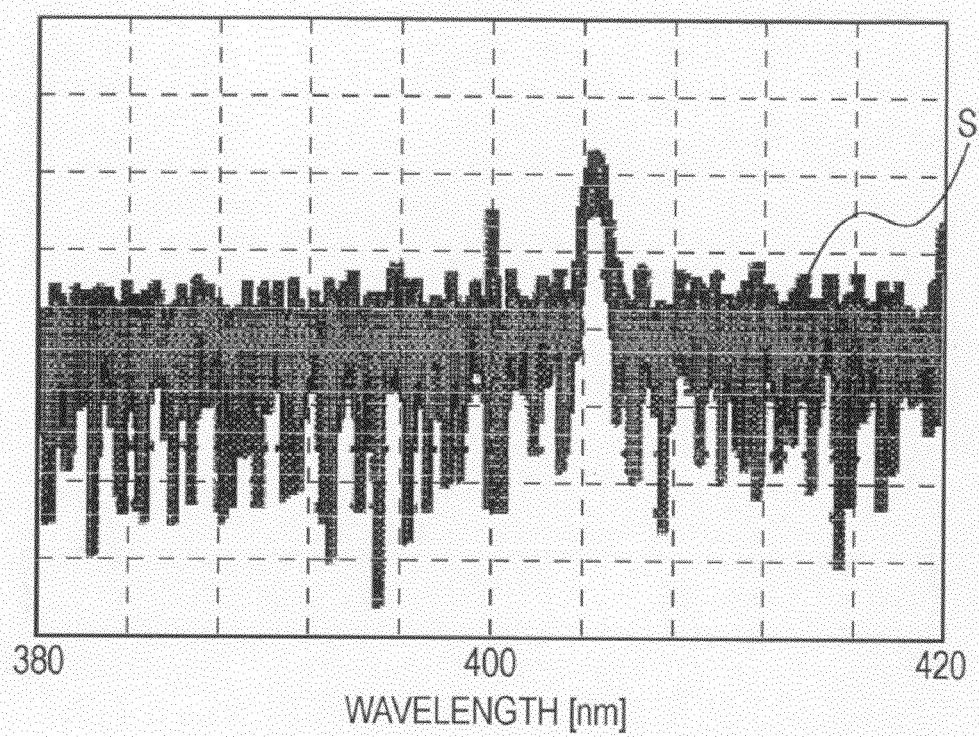
(B)
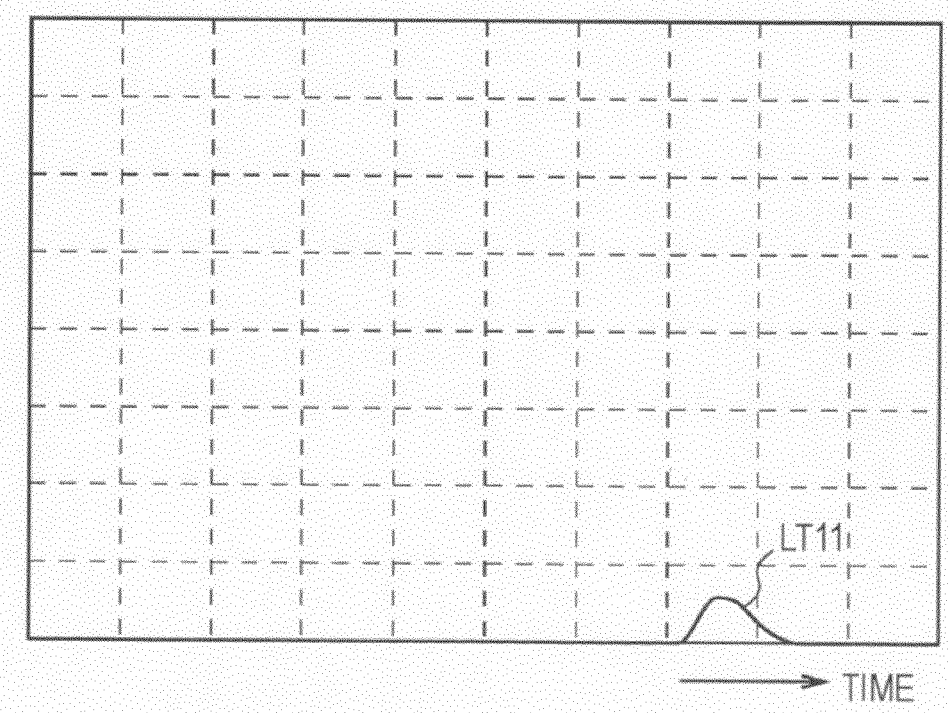

FIG. 16
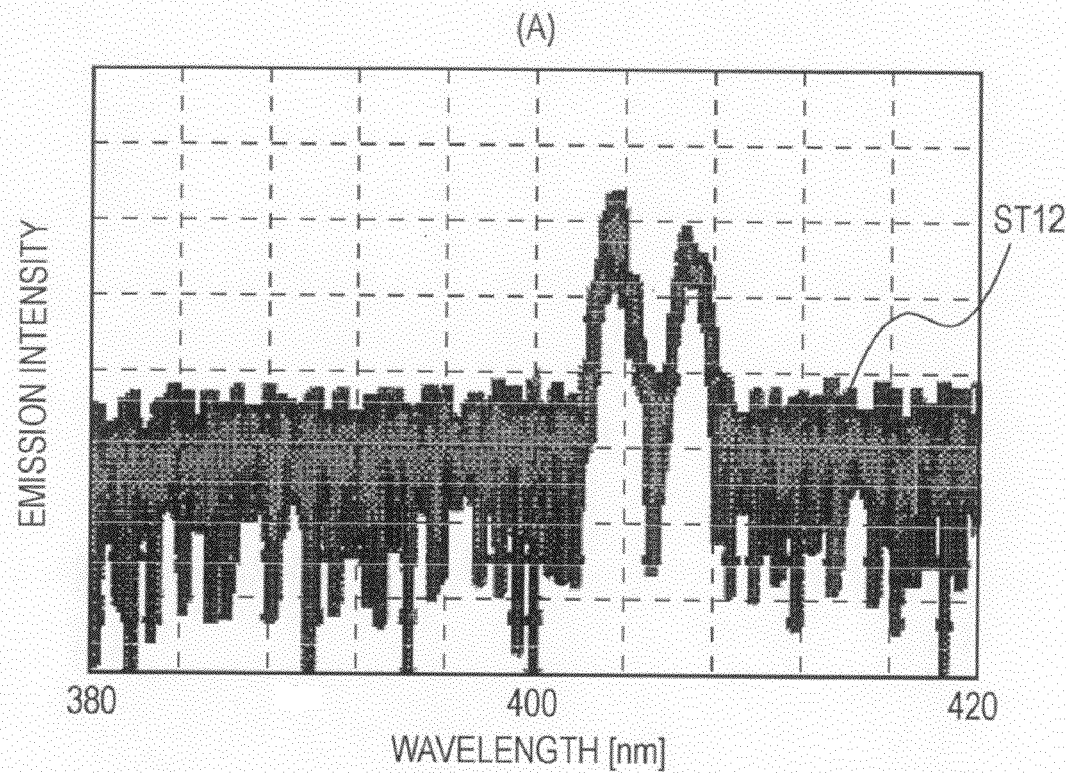
(A)
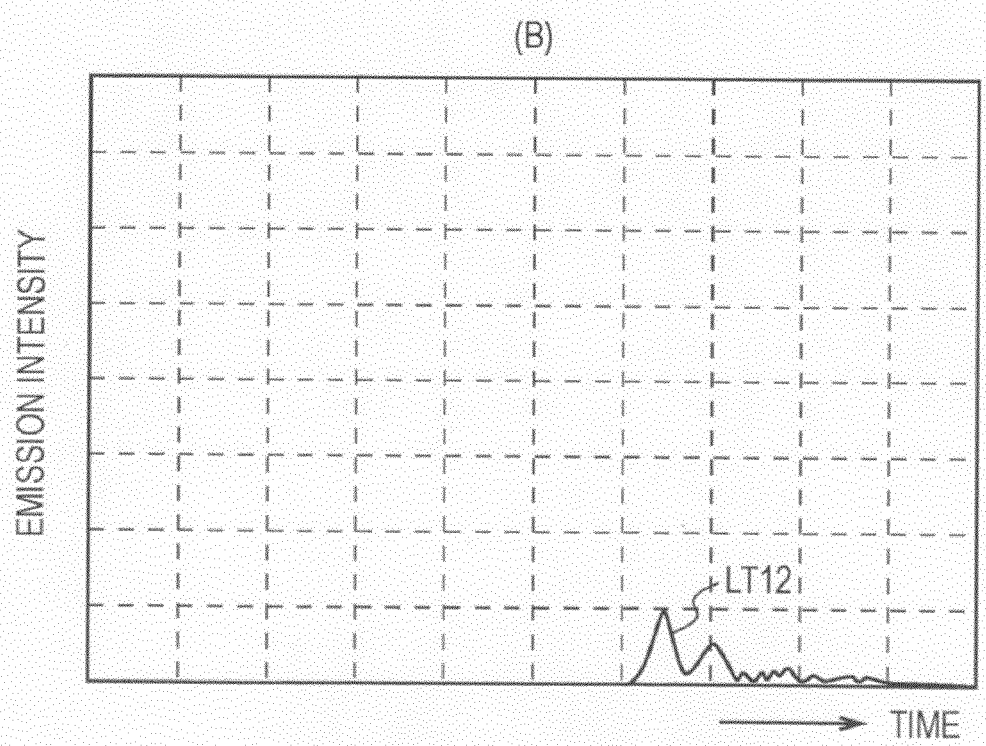
(B)

FIG. 17
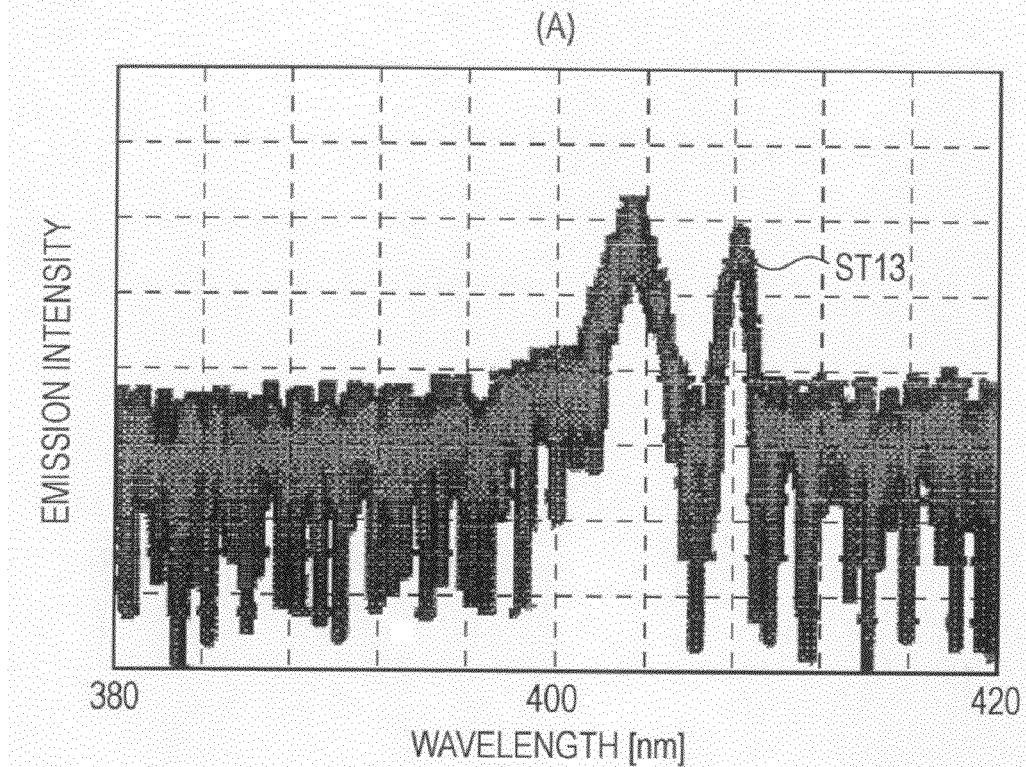
(A)
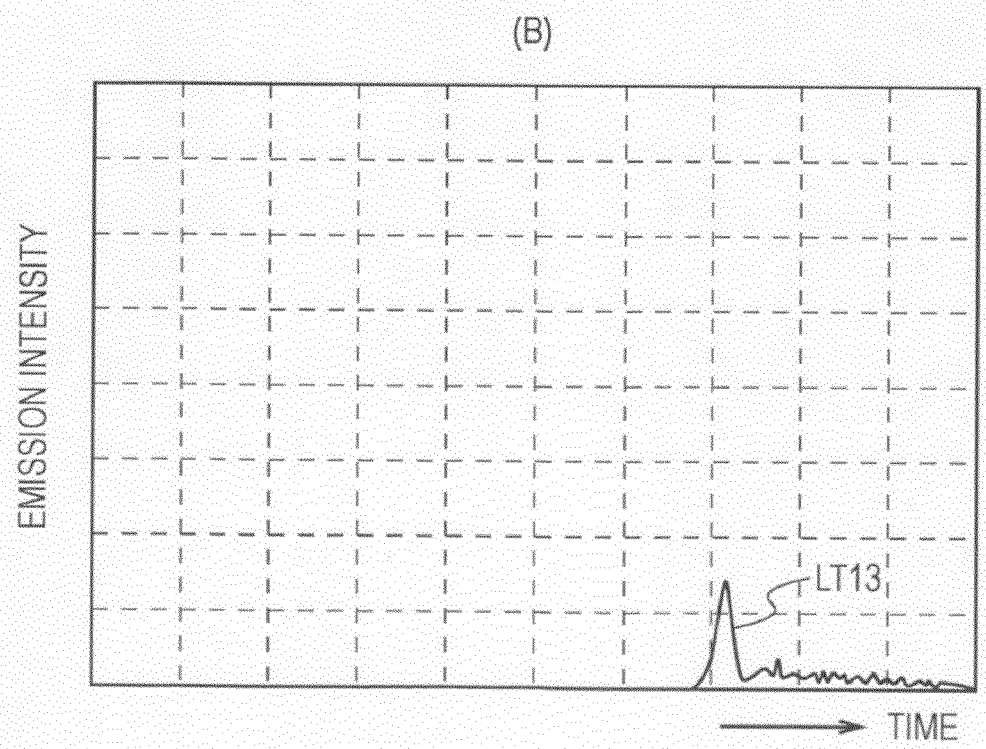
(B)

FIG. 18
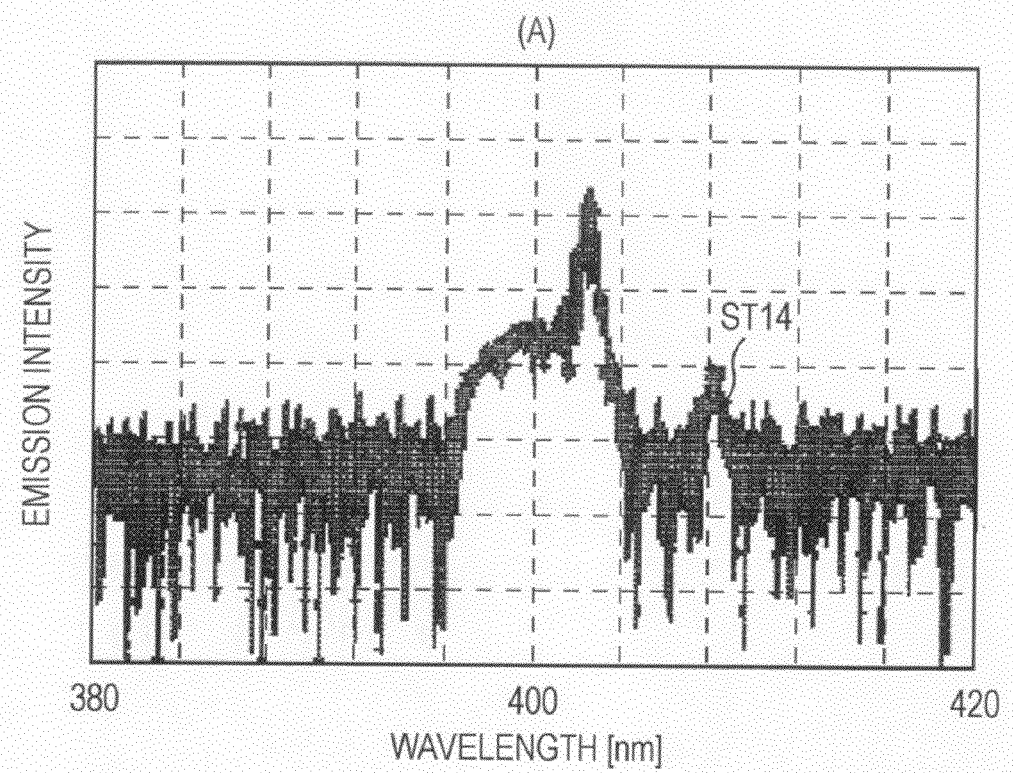
(A)
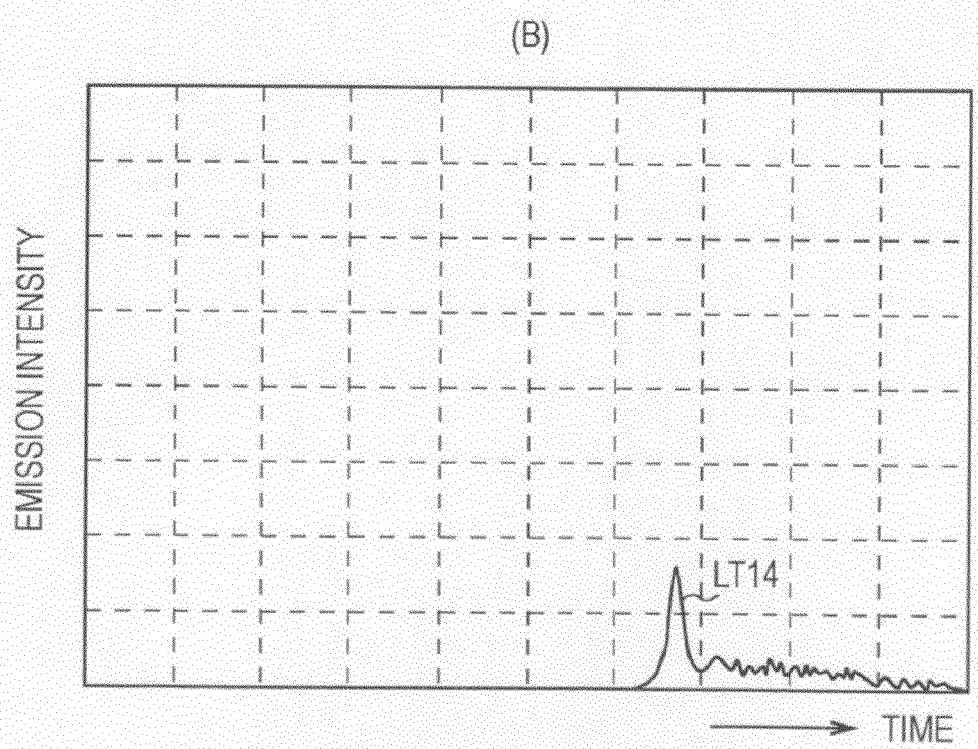
(B)

FIG. 19
(A)
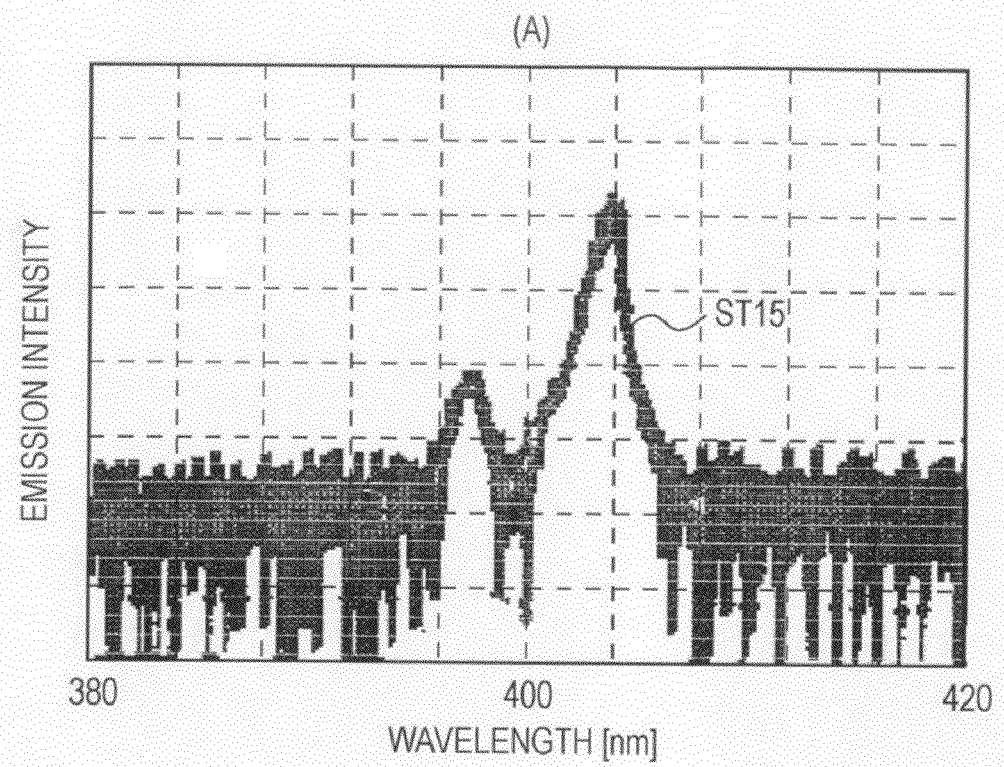
(B)
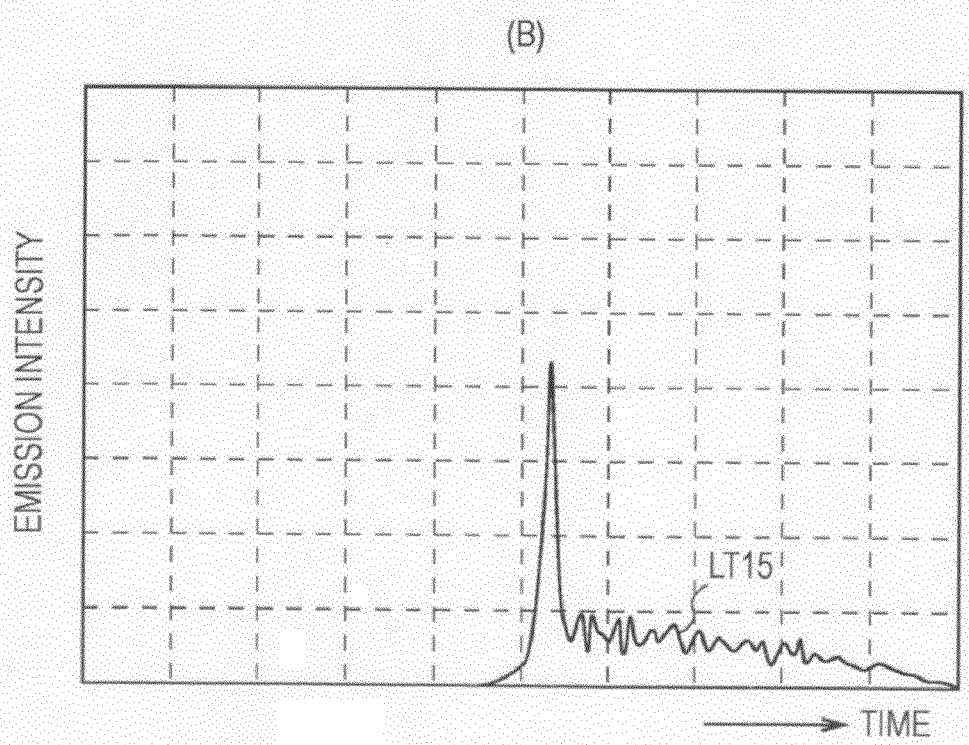

PHASES OF SET PULSES AND LASER LIGHT

PHASE SHIFT OF SET PULSES AND LASER LIGHT

SHORT-PULSE LIGHT SOURCE, LASER LIGHT EMISSION METHOD, OPTICAL DEVICE, OPTICAL DISC DEVICE, AND OPTICAL PICKUP

TECHNICAL FIELD

The present invention relates to a short-pulse light source, a laser light emission method, an optical device, an optical disc device, and an optical pickup. For example, the present invention is preferably applied to an optical disc device in which information is recorded using light beams.

BACKGROUND ART

Conventionally, disc-shaped optical information recording media have been widely used as optical information recording media, and CDs (Compact Discs), DVDs (Digital Versatile Discs), Blu-ray Discs (registered trademark, hereinafter called BDs), and the like are generally used.

On the other hand, in an optical disc device compatible with such optical information recording media, various types of content, such as music content and video content, or various types of information, such as various data for a computer, is recorded on an optical information recording medium. Particularly, in recent years, the amount of information has been increasing due to higher definition of images and higher sound quality of music, and also an increase in the number of pieces of content to be recorded on an optical information recording medium has been demanded. Thus, higher capacity has been demanded for optical information recording media.

Accordingly, an optical information recording medium has been suggested that is made by using a material for forming recording pits by causing a two-photon absorption reaction using light as a method for increasing the capacity of the optical information recording medium, whereby information is three-dimensionally recorded in the thickness direction of the optical information recording medium (e.g., see Patent Document 1).

Patent Document 1: Japanese Unexamined Patent Application Publication No. 2005-37658

Incidentally, the two-photon absorption reaction is a phenomenon that occurs only using light of high intensity, and thus a light source achieving a high emission intensity needs to be used as a light source. As the light source, a short-pulse light source that outputs laser light in a short-pulsed manner, such as a so-called picosecond laser or femtosecond laser, is used. For example, a titanium sapphire laser and a YAG (yttrium aluminum garnet) laser are known.

However, in such a short-pulse light source, output of short pulses is realized by an operation of an optical component provided outside a light generator. Therefore, the short-pulse light source typically has a large size and a high price, and thus mounting it in an optical disc device is unpractical.

Here, if laser light can be output in a pulsed manner directly from a semiconductor laser, which is a compact light generator typically used in an optical disc device, it is unnecessary to provide an optical component outside the light generator, and the size of the short-pulse light source can be significantly reduced. When it is assumed that laser light can be output in a short-pulsed manner from a semiconductor laser, the semiconductor laser needs to be controlled so that laser light is output in a desired short-pulsed manner in accordance with application of voltage.

DISCLOSURE OF INVENTION

The present invention has been made in view of the above-described points and is directed to providing a laser light emission method and a short-pulse light source that are capable of freely adjusting an emission period of a semiconductor laser, and an optical device, an optical disc device, and an optical pickup that use the short-pulse light source.

In order to solve the above-described problems, a short-pulse light source and an optical device according to the present invention are provided with a semiconductor laser configured to emit pulse-shaped laser light, and a laser control unit configured to, when applying a laser drive voltage having pulse-shaped drive voltage pulses to the semiconductor laser, vary a voltage period corresponding to an interval between the drive voltage pulses.

Accordingly, in the present invention, an output period of laser light can be freely adjusted.

Also, in a laser light emission method according to the present invention, a voltage period corresponding to an interval between pulse-shaped drive voltage pulses is varied when a semiconductor laser is caused to emit pulse-shaped laser light by applying a laser drive voltage having the drive voltage pulses to the semiconductor laser.

Accordingly, in the present invention, an output period of laser light can be freely adjusted.

Furthermore, an optical disc device and an optical pickup according to the present invention are provided with a semiconductor laser configured to emit pulse-shaped laser light, an irradiation unit configured to irradiate an optical information recording medium with the laser light, and a laser control unit configured to, when applying a laser drive voltage having pulse-shaped drive voltage pulses to the semiconductor laser, vary a voltage period corresponding to an interval between the drive voltage pulses.

Accordingly, in the present invention, an output period of,laser light can be freely adjusted.

According to the present invention, a laser light emission method and a short-pulse light source that are capable of varying a voltage period corresponding to an interval of a drive voltage and freely adjusting an emission period of a semiconductor laser, and an optical device, an optical disc device, and an optical pickup that use the short-pulse light source can be realized.

BRIEF DESCRIPTION OF DRAWINGS

FIG. 14 is a schematic diagram illustrating voltages and waveforms of laser light.

FIG. 15 is a schematic diagram illustrating laser light when voltage is 8.8 [V].

FIG. 16 is a schematic diagram illustrating laser light when voltage is 13.2 [V].

FIG. 17 is a schematic diagram illustrating laser light when voltage is 15.6 [V].

FIG. 18 is a schematic diagram illustrating laser light when voltage is 17.8 [V].

FIG. 19 is a schematic diagram illustrating laser light when voltage is 38.4 [V].

BEST MODES FOR CARRYING OUT THE INVENTION

Hereinafter, embodiments of the present invention will be described in detail in the following order with reference to the drawings.

Figure 1:
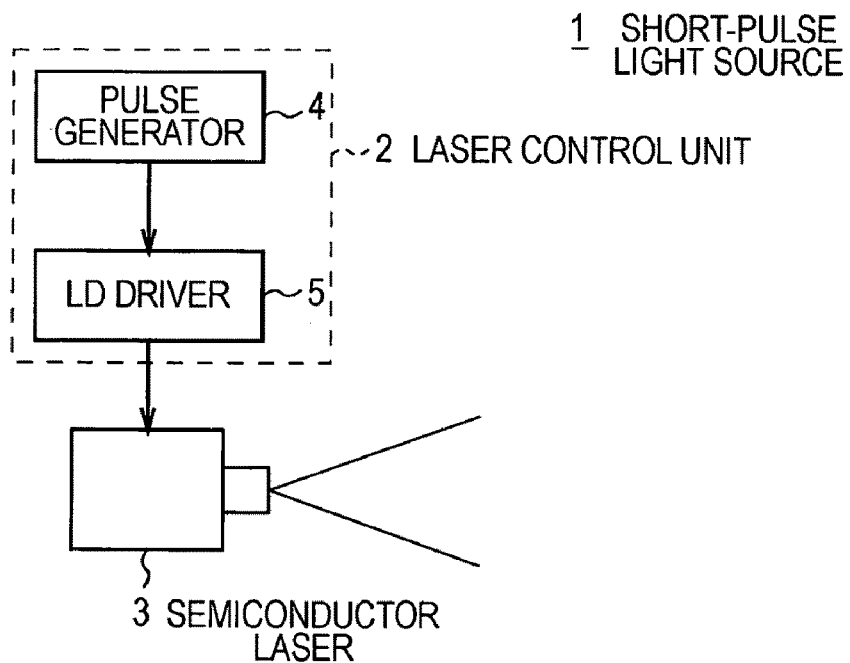
FIG. 1 is a schematic diagram illustrating a configuration of a short-pulse light source according to a first embodiment.

1. First Embodiment (Configuration of Short-Pulse Light Source)
2. Second Embodiment (Control to Achieve Constant Emission Intervals in Short-Pulse Light Source)
3. Third Embodiment (Control to Achieve Arbitrary Emission Intervals in Optical Disc Device)
  (1) First Embodiment
  (1-1) Configuration of Short-Pulse Light Source In FIG. 1, reference numeral 1 denotes an entire short-pulse light source according to this embodiment. The short-pulse light source 1 includes a laser control unit 2 and a semiconductor laser 3.

The semiconductor laser 3 is a typical semiconductor laser that uses semiconductor emission (e.g., SLD3233 made by Sony Corporation). The semiconductor laser 3 is configured to output laser light LL in a pulsed manner under control performed by the laser control unit 2.

The laser control unit 2 includes a pulse generator 4 and an LD (Laser Diode) driver 5. As illustrated in part (A), of FIG. 2, the pulse generator 4 generates a pulse signal SL in which pulse-shaped generated signal pulses SLw are discretely generated, and supplies the pulse signal SL to the LD driver 5. At this time, the pulse generator 4 controls the signal level of the generated signal pulses SLw in accordance with control of an external device, for example.

Figure 2:
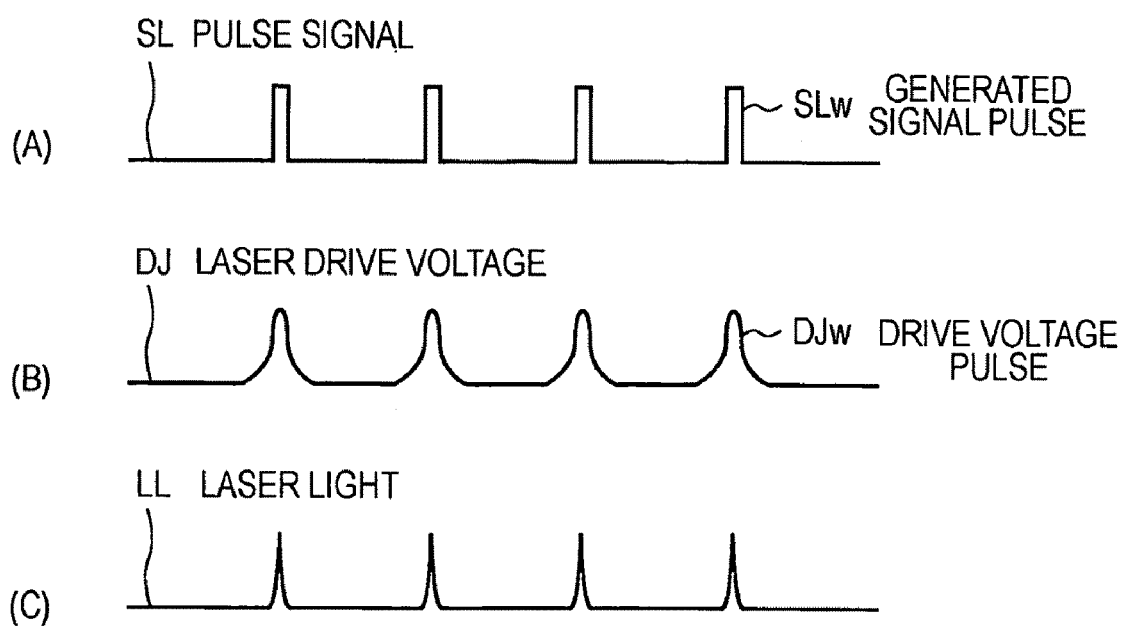
FIG. 2 is a schematic diagram illustrating a pulse signal and a laser drive voltage.

As illustrated in part (B) of FIG. 2, the LD driver 5 amplifies the pulse signal SL with a predetermined amplification factor to generate a laser drive voltage DJ in which drive voltage pulses DJw are generated in accordance with the generated signal pulses SLw, and supplies the laser drive voltage DJ to the semiconductor laser 3. At this time, the voltage value of the drive voltage pulses DJw is determined in accordance with the signal level of the generated signal pulses SLw.

Then, the semiconductor laser 3 outputs laser light LL in a pulsed manner in accordance with the laser drive voltage DJ.

As described above, the short-pulse light source 1 is configured to output laser light LL in a pulsed manner directly from the semiconductor laser 3 in accordance with control performed by the laser control unit 2.

(1-2) Output of Laser Light in Pulsed Manner in Relaxation Oscillation Mode

The following equation is a so-called rate equation that expresses characteristics of laser. Here, $\Gamma$ represents a confinement factor, $\tau_{ph}$ represents a photon lifetime, $\tau_s$ represents a carrier lifetime, $C_s$ represents a spontaneous emission coupling coefficient, d represents the thickness of an active layer, q represents an elementary charge, $g_{max}$ represents a maximum gain, N represents a carrier density, S represents a photon density, J represents an injection carrier density, c represents the velocity of light, $N_0$ represents a clearing carrier density, and $n_g$ represents a group index.

$$\frac{dN}{dt} = -\Gamma GS - \frac{N}{\tau_s} + \frac{J}{dq} \quad (1)$$

$$\frac{dS}{dt} = \Gamma GS - \frac{S}{\tau_{ph}} + C_s \frac{N}{\tau_s}$$

$$\text{Note that } G = \frac{c}{n_g} A_g (N - N_0) = \frac{c}{n_g} g_{max}$$

Figure 3:
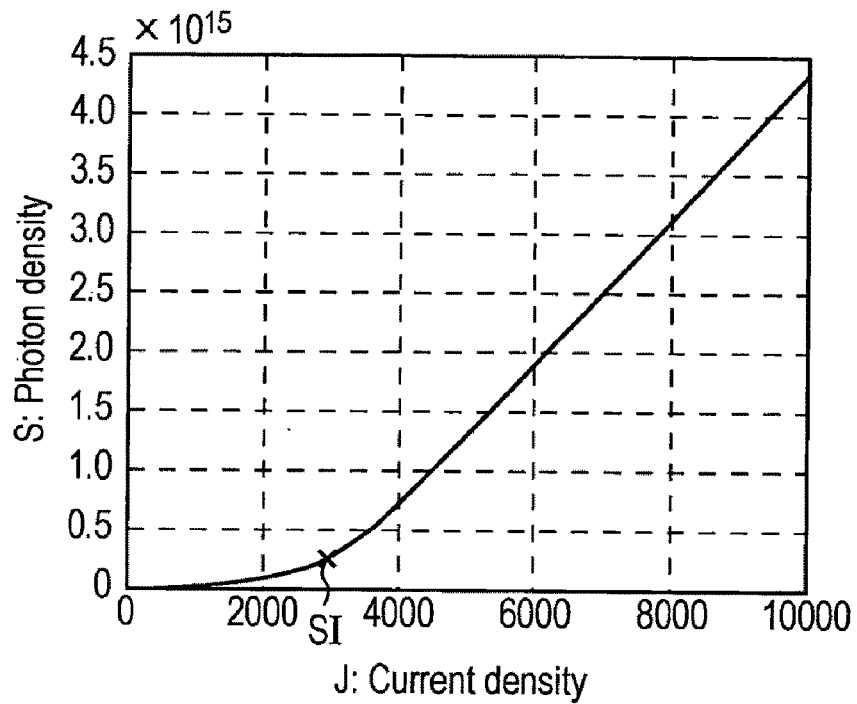
FIG. 3 is a schematic diagram for explaining a relationship between injection carrier density and photon density.
Figure 4:
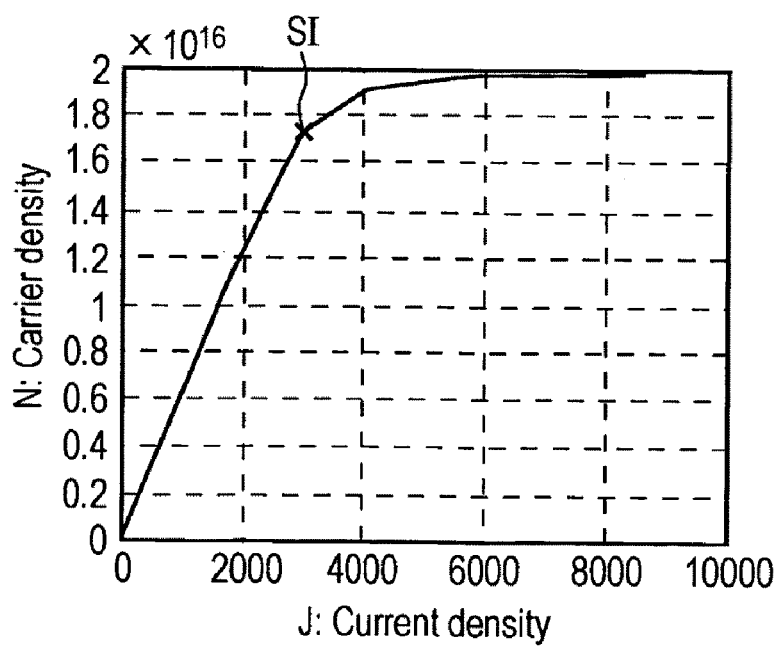
FIG. 4 is a schematic diagram for explaining a relationship between injection carrier density and carrier density.

FIGS. 3 and 4 illustrate relationships between the photon density S and the carrier density N and the injection carrier density J obtained from equation (1). Note that, in FIGS. 3 and 4, calculation was performed under the assumption that $\Gamma=0.3$, $Ag=3e^{-16}$ $[cm^2]$, $\tau_{ph}=1e^{-12}$ [s], $\tau_s=1e^{-9}$ [s], $C_s=0.03$, $d=0.1$ [μm], and $q=1.6e^{-19}$ [C].

As illustrated in FIG. 4, a typical semiconductor laser starts emitting light at a pre-saturation point S1, at which the carrier density N is just lower than that of a saturation state in accordance with an increase in the injection carrier density J (that is, laser drive voltage DJ). Also, as illustrated in FIG. 3, the semiconductor laser increases the photon density S (that is, emission intensity) in accordance with an increase in the injection carrier density J. Also, as illustrated in FIG. 5, which corresponds to FIG. 3, it can be understood that the photon density S further increases in accordance with a further increase in the injection carrier density J.

Figure 5:
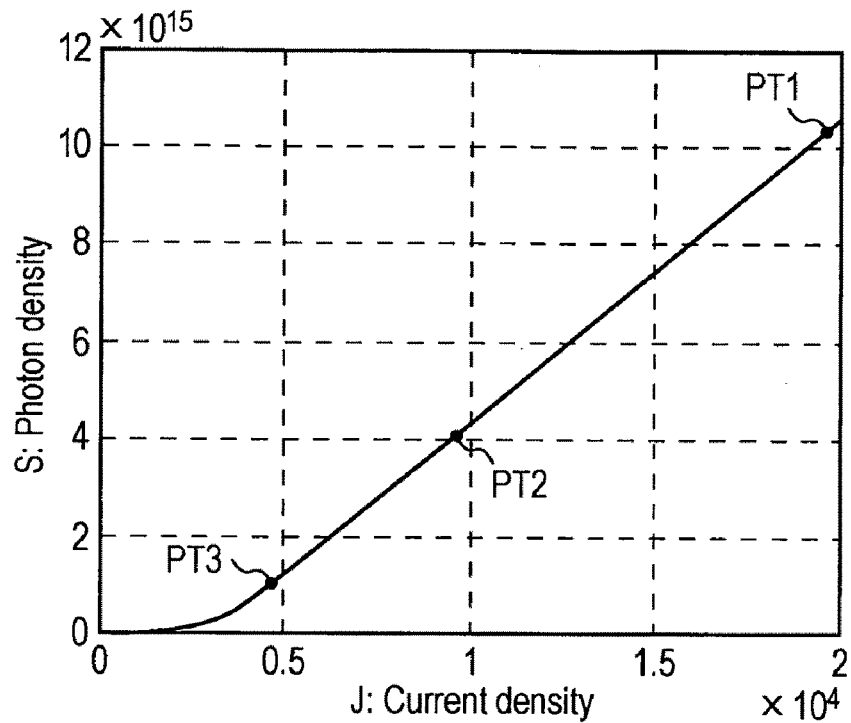
FIG. 5 is a schematic diagram for explaining a relationship between injection carrier density and photon density.
Figure 6:
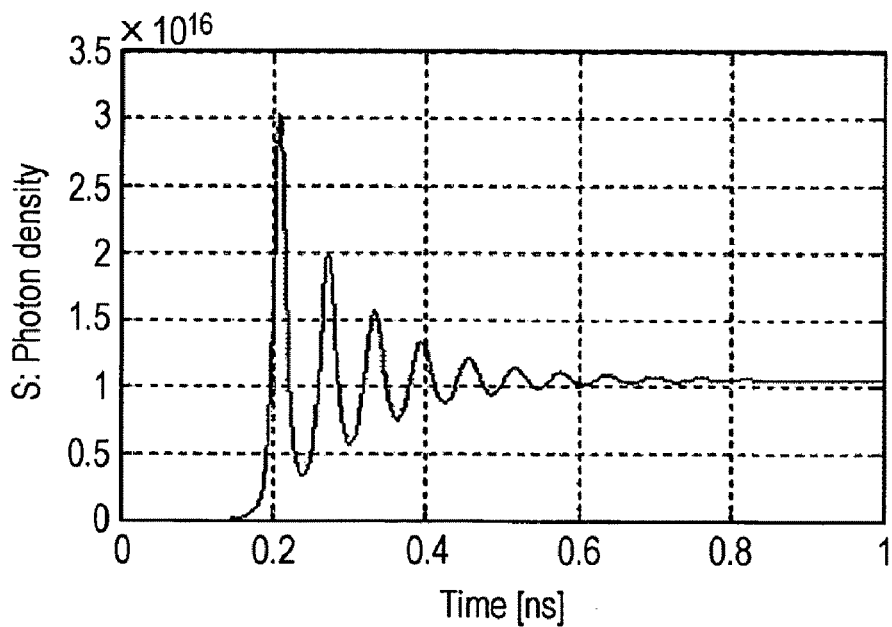
FIG. 6 is a schematic diagram for explaining photon density at PT1.
Figure 7:
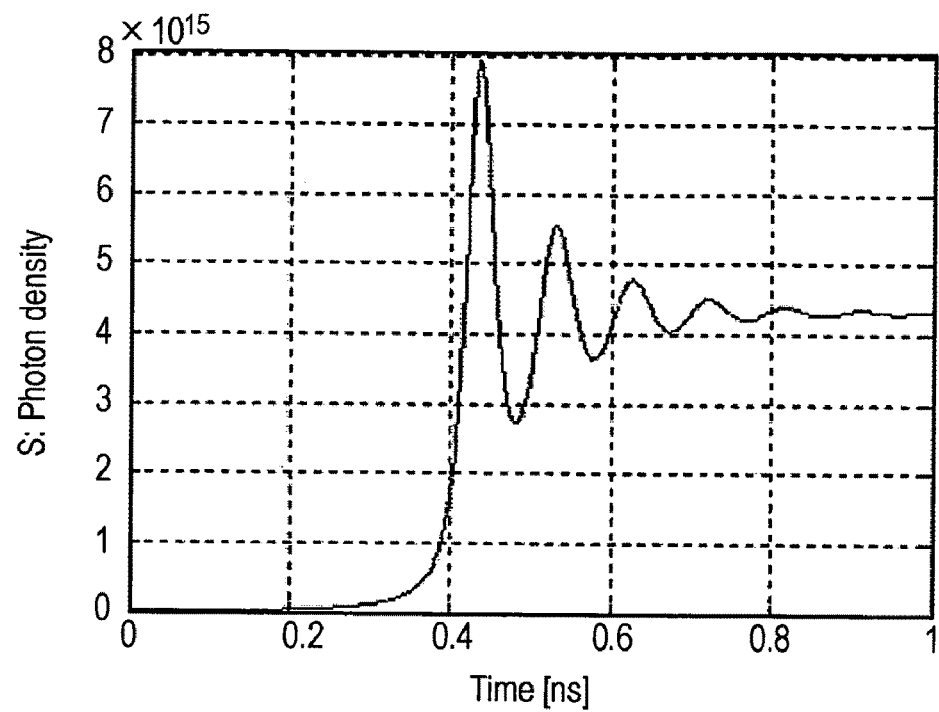
FIG. 7 is a schematic diagram for explaining photon density at PT2.

In FIGS. 5, 6, and 7, the horizontal axis indicates the time from when application of a laser drive voltage DJ (that is, injection carrier density J) starts at points PT1, PT2, and PT3 illustrated in FIG. 5, and the vertical axis indicates the photon density S.

As illustrated in FIG. 6, it was determined that, at point PT1 indicating a case where the highest laser drive voltage DJ is applied, the amplitude of the photon density S increases due to significant oscillation of relaxation oscillation and an oscillation period to serving as a period of amplitude (that is, from a minimum value to the minimum value) is short of about 60 [ps]. The value of the photon density S is the largest at the amplitude of a first wave that appears just after start of emission, gradually attenuates in a second wave, a third wave, and so on, and eventually stabilizes.

The maximum value of the first wave in the photon density S at point PT1 was about $3 \times 10^{16}$, about three times a stable value (about $1 \times 10^{16}$), which is a value when the photon density S is stabilized.

Here, an emission start time $\tau d$ from when application of a laser drive voltage DJ starts to when emission of light starts can be calculated using the rate equation in equation (1). That is, when it is assumed that the photon density S=0 because oscillation has not started, the upper equation in equation (1) can be expressed by the following equation.

$$\frac{dN}{dt} = \frac{N}{\tau_s} + \frac{J}{dq} \quad (2)$$

Here, when it is assumed that the carrier density N is at a threshold value $N_{th}$, the emission start time $\tau d$ can be expressed by the following equation.

$$\tau d = \tau_s N_{th} \frac{J_{th}}{J} \quad (3)$$

Note that $J_{th} = \frac{dq}{\tau_s} N_{th}$

That is, it can be understood that the emission start time $\tau d$ is inversely proportional to the injection carrier density J.

At point PT1 illustrated in FIG. 6, the emission start time $\tau d$ is calculated as about 200 [ps] in accordance with equation (3). At point PT1, a laser drive voltage DJ having a large voltage value is applied, and thus the emission start time $\tau d$ is short.

As illustrated in FIG. 7, at point PT2 where the value of the applied laser drive voltage DJ is smaller than at point PT1, definite relaxation oscillation occurred, but the amplitude of oscillation was smaller than at point PT1 and the oscillation period to was longer of about 100 [ps]. Also, at point PT2, the emission start time $\tau d$ was about 400 [ps], longer than at point PT1. The maximum value of a first wave in the photon density S at point PT2 was about $8 \times 10^{15}$, about twice a stable value (about $4 \times 10^{15}$).

Figure 8:
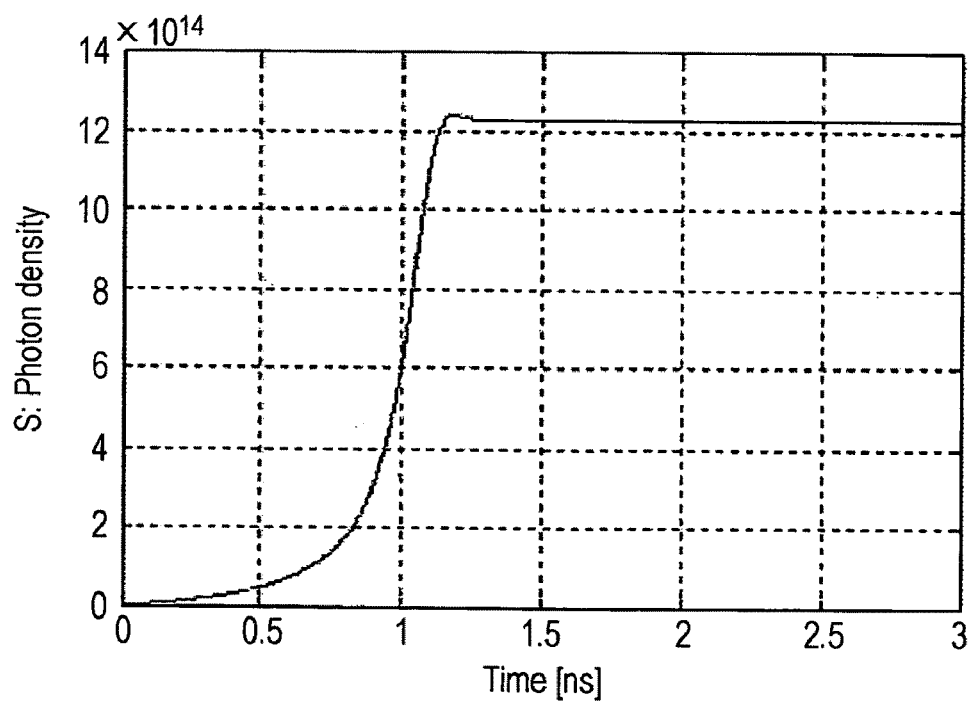
FIG. 8 is a schematic diagram for explaining photon density at PT3.

As illustrated in FIG. 8, it was determined that, at point PT3 where the value of the supplied laser drive voltage DJ is smaller than at point PT2, relaxation oscillation hardly occurs and the emission start time $\tau d$ is relatively long of about 1 [ns].

The maximum value in the photon density S at point PT3 was almost the same as a stable value, about $1.2 \times 10^{15}$.

In a typical laser light source, a difference in emission intensity just after start of emission is intentionally decreased by applying, to a semiconductor laser, a relatively low laser drive voltage DJ that satisfies a condition (voltage value) in which relaxation oscillation hardly occurs as at point PT3, whereby laser light LL is stably output. Hereinafter, a mode in which the semiconductor laser 3 outputs laser light LL using a low voltage that does not cause relaxation oscillation is called a normal mode, and the laser light LL output in the normal mode is called normal output light LNp.

However, in the short-pulse light source 1 according to this embodiment, relaxation oscillation is caused as at points PT1 and PT2, whereby an instantaneous maximum value of the emission intensity of laser light is increased to higher than a stable value (e.g., 1.5 times or more). Also, a large value can be selected as a voltage value for causing relaxation oscillation (hereinafter this is called an oscillation voltage value $\alpha$), and thus laser light having a high emission intensity according to a large oscillation voltage value $\alpha$ can be emitted.

That is, the emission intensity of laser light can be significantly increased compared to in a related art by applying a laser drive voltage DJ having an oscillation voltage value $\alpha$ to the same semiconductor laser. For example, at point PT1, the photon density S of the first wave of relaxation oscillation is about $3 \times 10^{16}$, and the emission intensity of the semiconductor laser 3 can be increased by twenty times or more compared to at point PT3 (about $1.2 \times 10^{15}$) indicating a case where a conventional voltage value is applied.

Figure 9:
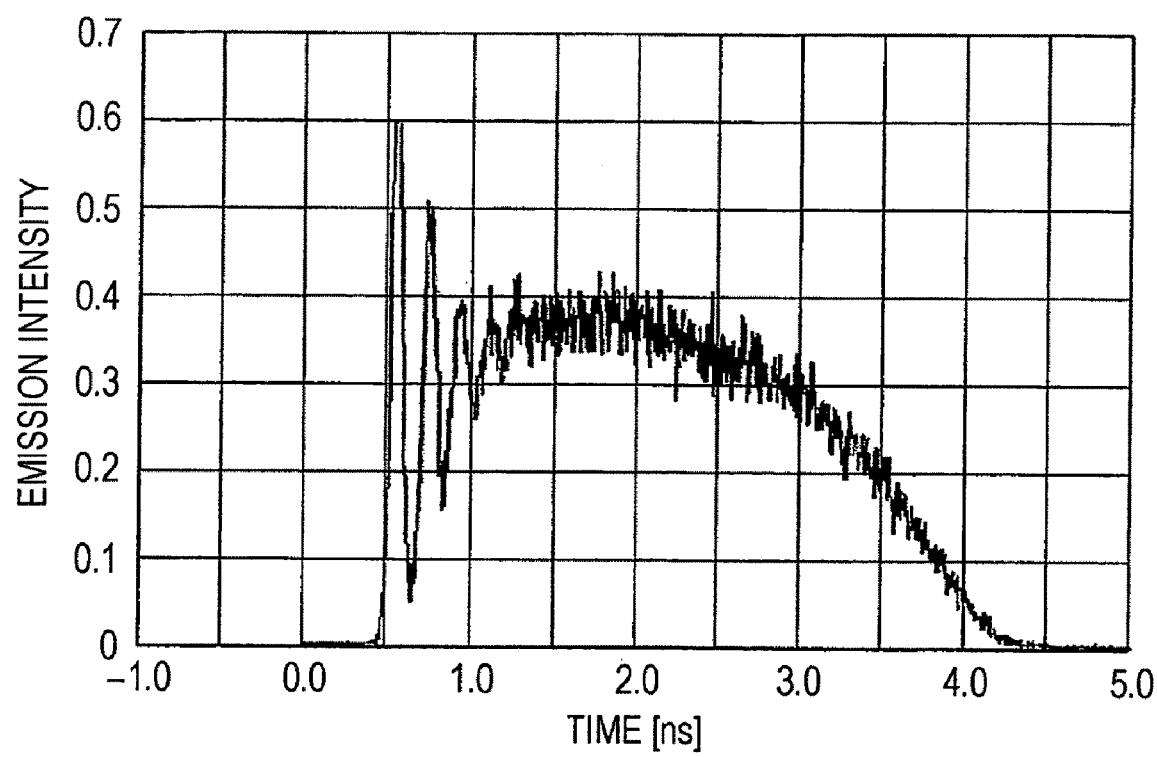
FIG. 9 is a schematic diagram illustrating an actual waveform of emitted light.

FIG. 9 illustrates the emission intensity that was actually measured when a relatively high laser drive voltage DJ was applied to a typical semiconductor laser (SLD3233VF, made by Sony Corporation). It was determined from the figure that the relaxation oscillation that is seen in the photon density S in FIGS. 6 and 7 is represented as is in the emission intensity and that similar relaxation oscillation actually occurs, as the emission intensity. Note that FIG. 9 illustrates the waveform of laser light LL that was obtained when a laser drive voltage DJ was supplied to the semiconductor laser in a rectangular pulsed manner. Note that a portion supplied in a pulsed manner of the laser drive voltage DJ is hereinafter called a drive voltage pulse DJw.

Figure 10:
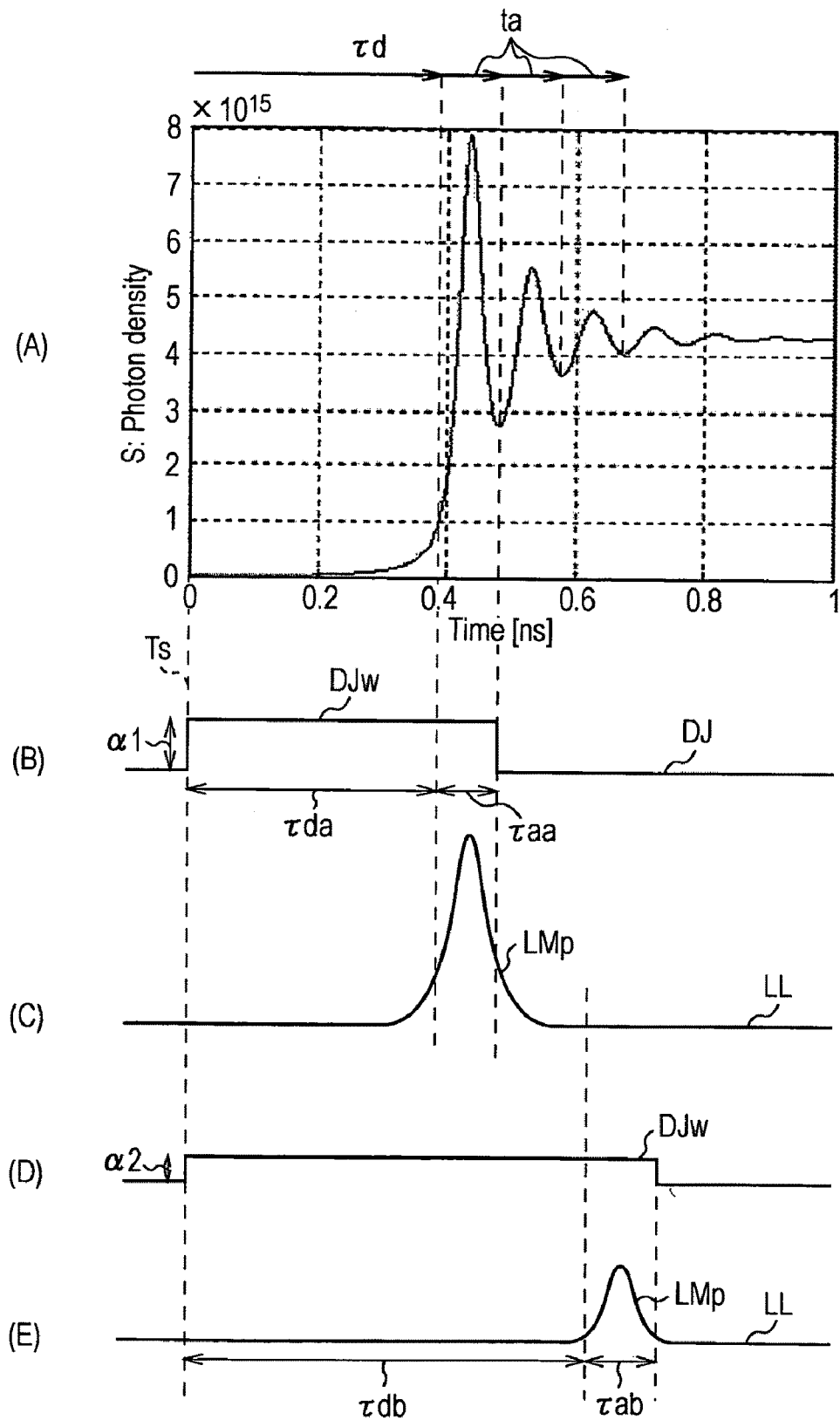
FIG. 10 is a schematic diagram for explaining a drive current and an emission intensity.

Part (A) of FIG. 10 is a figure corresponding to FIG. 7. For example, as illustrated in part (B) of FIG. 10, the laser control unit 2 of the short-pulse light source 1 supplies, to the semiconductor laser 3, a laser drive voltage DJ having an oscillation voltage value $\alpha1$ that is sufficient to cause relaxation oscillation, as a drive voltage pulse DJw. At this time, the laser control unit 2 applies the laser drive voltage DJ having a rectangular pulse as the drive voltage pulse DJw for the time of the sum of the emission start time $\tau d$ and the oscillation period ta ($\tau d + ta$). Hereinafter, this time is called a current wave supplying time.

Accordingly, as illustrated in part (C) of FIG. 10, the laser control unit 2 can cause the semiconductor laser 3 to emit only a first wave based on relaxation oscillation and can cause the semiconductor laser 3 to emit pulse-shaped laser light LL having a high emission intensity (hereinafter this is called oscillation output light LMp).

Also, by supplying a pulse-shaped drive voltage pulse DJw, the laser control unit 2 can shorten the time of applying a laser drive voltage DJ having a high voltage value, and can suppress a trouble of the semiconductor laser 3 that occurs due to overheat or the like of the semiconductor laser 3.

On the other hand, as illustrated in part (D) of FIG. 10, the laser control unit 2 supplies, to the semiconductor laser 3, a drive voltage pulse DJw having an oscillation voltage value α2, which is sufficient to cause relaxation oscillation and which is smaller than the oscillation voltage value α1, thereby being able to cause the semiconductor laser 3 to emit oscillation output light LMp having a relatively low emission intensity. Note that, hereinafter, a mode in which the semiconductor laser 3 causes relaxation oscillation to output laser light LL in a pulsed manner is called a relaxation oscillation mode, which is distinguished from the normal mode, in which relaxation oscillation is not caused.

As described above, the short-pulse light source 1 controls the voltage value of a drive voltage pulse DJw so as to cause relaxation oscillation in laser light LL, thereby being able to output laser light LL in a pulsed manner in the oscillation relaxation mode.

(1-3) Output of Laser Light in Pulsed Manner in Specific Mode

The inventor of the present application has found that laser light LL having an emission intensity higher than that of oscillation output light LMp can be output in a pulsed manner from the semiconductor laser 3 by supplying, to the semiconductor 3, a drive voltage pulse DJw having a specific voltage value β, which is larger than the oscillation voltage value α that causes relaxation oscillation in laser light LL.

Next, a description will be given about a result of experiment in which change of laser light LL in a case where the voltage value of a drive voltage pulse DJw is changed was measured.

Figure 11:
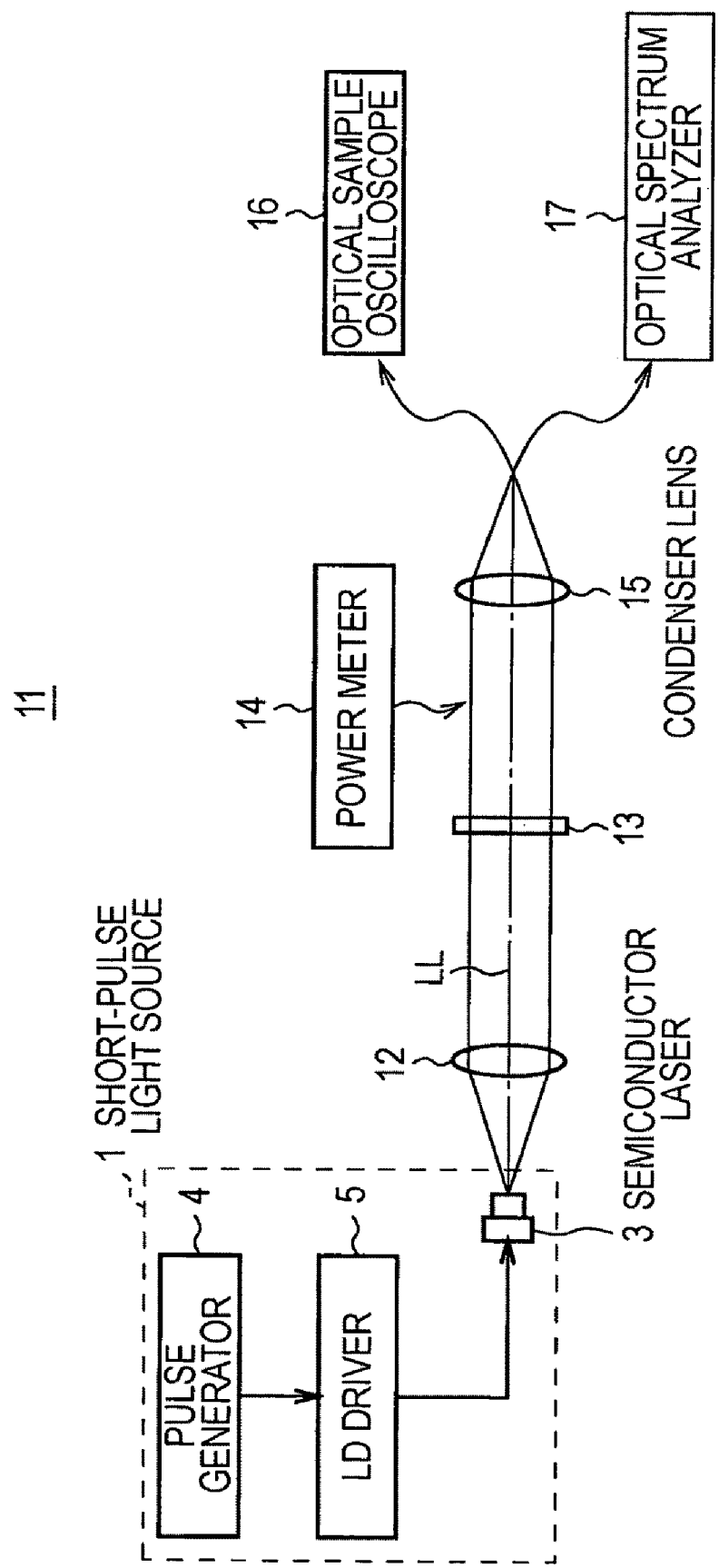
FIG. 11 is a schematic diagram illustrating a configuration of a light measurement device.

FIG. 11 illustrates a configuration of a light measurement device 11 that analyzes laser light LL emitted from the short-pulse light source 1.

In the short-pulse light source 1 in the light measurement device 11, laser light LL emitted from the semiconductor laser 3 was supplied to a collimator lens 12.

The laser light LL was transformed from divergent light into parallel light by the collimator lens 12 and entered a condenser lens 15 via a BPF (Band Pass Filter) 13. Note that the BPF 13 was set or removed according to need. The laser light LL was condensed by the condenser lens 15 and was then measured and analyzed by an optical sample oscilloscope 16 (C8188-01, made by Hamamatsu Photonics K.K.) and an optical spectrum analyzer 17 (Q8341, made by ADC Corporation).

Also, a power meter 14 (Q8230, made by ADC Corporation) was set between the collimator lens 12 and the condenser lens 15, and the emission intensity of the laser LL was measured.

Figure 12:
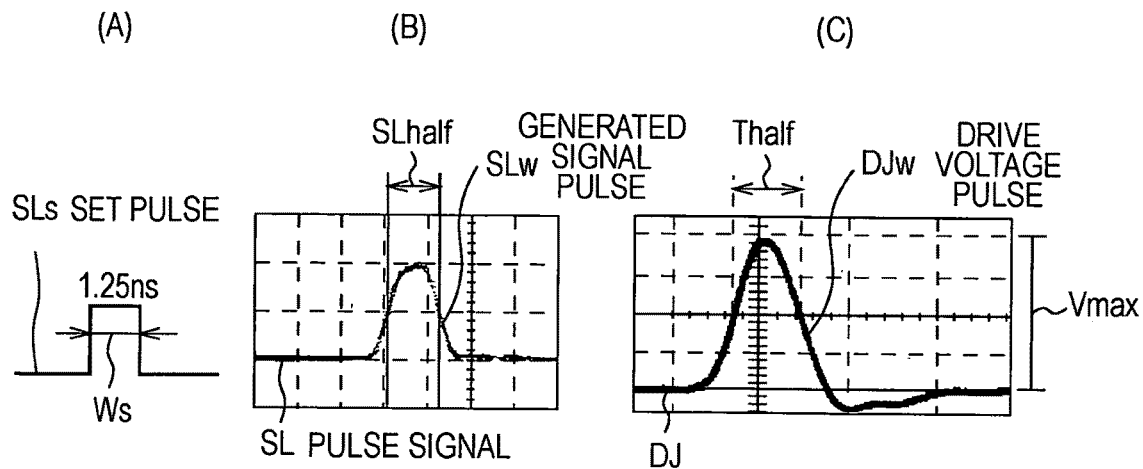
FIG. 12 is a schematic diagram illustrating the shapes of individual pulses.

As illustrated in part (A) of FIG. 12, in a case where a rectangular set pulse SLs having a pulse width Ws of 1.5 [ns] was set in the pulse generator 4, a pulse signal SL actually output from the pulse generator 4 had the waveform illustrated in part (B) of FIG. 12. In this pulse signal SL, a signal pulse half-width SLhalf, which is the half-width of a pulse that appears in accordance with the set pulse SLs (hereinafter this is called a generated signal pulse SLw), was about 1.5 [ns].

In a case where the pulse signal SL illustrated in part (B) of FIG. 12 was input, a laser drive voltage DJ actually output from the LD driver 5 had the waveform illustrated in part (C) of FIG. 12. In this laser drive voltage DJ, a voltage pulse half-width Thalf, which is the half-width of a pulse that appears in accordance with the generated signal pulse SLw (that is, the drive voltage pulse DJw), changed in a range of about 1.5 [ns] to about 1.7 [ns] in accordance with the signal level of the generated signal pulse SLw.

Figure 13:
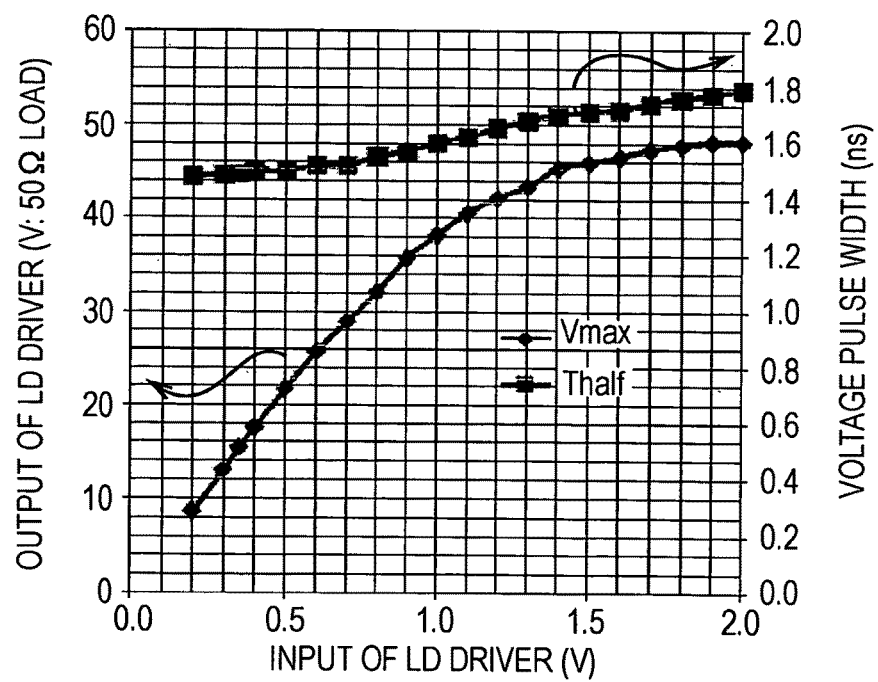
FIG. 13 is a schematic diagram illustrating a relationship between a pulse signal and a drive voltage pulse.

FIG. 13 illustrates a relationship between the signal level (maximum voltage value) of the generated signal pulse SLw and the voltage pulse half-width Thalf in the drive voltage pulse DJw, and a relationship between the signal level of the generated signal pulse SLw and the maximum voltage value Vmax in the drive voltage pulse DJw at this time.

As can be understood from FIG. 13, as the voltage value of the generated signal pulse SLw input to the LD driver 5 increases, the maximum voltage value Vmax of the drive voltage pulse DJw output from the LD driver 5 increases. Also, it can be understood that, as the voltage value of the pulse signal SL increases, the voltage pulse half-width Thalf of the drive voltage pulse DJw gradually increases.

In other words, it can be understood that, even in a case where a set pulse SLs having the same pulse width is set in the pulse generator 4, the pulse width and the voltage value of the drive voltage pulse DJw output from the LD driver 5 change when the maximum voltage value of the generated signal pulse SLw supplied to the LD driver 5 changes.

Parts (A) and (B) of FIG. 14 illustrate a result obtained by measuring the laser light LL output in accordance with such a drive voltage pulse DJw using the optical sample oscilloscope 16. Note that, in FIG. 14, the horizontal axis indicating the time indicates relative values, and individual waveforms are staggered so that the shapes of the waveforms can be easily seen. Note that the BPF 13 was not set in this measurement.

As illustrated in part (A) of FIG. 14, when the maximum voltage value Vmax of the drive voltage pulse DJw was 8.8 [V], only one low output peak having a relatively large width was seen (in the vicinity of 1550 [ps] in the time) and oscillation of relaxation oscillation was not seen in a waveform LT1 of the laser light LL. That is, the waveform LT1 represents that the short-pulse light source 1 outputs normal output light LNp in the normal mode.

As illustrated in part (A) of FIG. 14, when the maximum voltage value Vmax of the drive voltage pulse DJw was 13.2 [V], a plurality of peaks due to relaxation oscillation were seen in a waveform LT2 of the laser light LL. That is, the waveform LT2 represents that the short-pulse light source 1 outputs oscillation output light LMp in the relaxation oscillation mode.

As illustrated in part (B) of FIG. 14, when the maximum voltage value Vmax of the drive voltage pulse DJw was 17.8 [V], 22.0 [V], 26.0 [V], and 29.2 [V], a peak at the top in the time axis direction and a slope portion of gradual attenuation with fine oscillation were seen in waveforms LT3, LT4, LT5, and LT6 of the laser light LL.

The waveforms LT3, LT4, LT5, and LT6 of the laser light LL do not have a high peak after the peak at the top, and the shapes thereof are distinctly different from the waveform LT2 (part (A) of FIG. 14) in the relaxation oscillation mode having peaks of second and third waves after the first wave.

In addition, although not shown in each figure since the resolution of the optical sample oscilloscope 16 used in the measurement is about 30 [ps] or more, it was determined from an experiment using a streak camera that the peak width (half-width) of the peak at the top is about 10 [ps]. Also, in accordance with this, the maximum emission intensity of the peak at the top is shown as lower than an actual intensity.

Here, further analysis will be performed on the laser light LL when the maximum voltage value Vmax of the drive voltage pulse DJw was changed.

FIGS. 15 to 19 illustrate results obtained by measuring, in the same manner using the optical spectrum analyzer 17, the emission intensity of laser light LL obtained when the maximum voltage value Vmax of the drive voltage pulse DJw was changed. Note that parts (A) of FIGS. 15 to 19 illustrate results of decomposing the laser light LL in units of wavelengths, and that parts (B) of FIGS. 15 to 19 illustrate results of decomposing the laser light LL in the time axis direction as in FIG. 14. In addition, the BPF 13 was not set in this measurement.

As illustrated in part (B) of FIG. 15, when the maximum voltage value Vmax of the drive voltage pulse DJw was 8.8 [V], only one peak was seen in a waveform LT11 of laser light LL. Thus, the laser light LL can be determined to be normal output light LNp in the normal mode. Also, as illustrated in part (A) of FIG. 15, only one peak was seen at about 404 [nm] in its spectrum ST11. Accordingly, it can be understood that the waveform LT11 illustrated in part (B) of FIG. 15 is based on laser light LL having a wavelength of about 404 [nm].

As illustrated in part (B) of FIG. 16, when the maximum voltage value Vmax of the drive voltage pulse DJw was 13.2 [V], a plurality of high peaks were seen in a waveform LT12 of laser light LL. Thus, the laser light can be determined to be oscillation output light LMp in the relaxation oscillation mode. Also, as illustrated in part (A) of FIG. 16, two peaks were seen at about 404 [nm] and at about 407 [nm] in its spectrum ST12. Accordingly, it can be understood that the waveform LT2 illustrated in part (B) of FIG. 16 is based on laser light LL having wavelengths of about 404 [nm] and about 407 [nm].

As illustrated in part (B) of FIG. 17, when the maximum voltage value Vmax of the drive voltage pulse DJw was 15.6 [V], a peak at the top and a slope portion of gradual attenuation were seen in a waveform LT13 of laser light LL. At this time, as illustrated in part (A) of FIG. 17, two peaks were seen at about 404 [nm] and at about 408 [nm] in a spectrum ST13. In the spectrum ST13, the peak at about 406 [nm] that was seen in the relaxation oscillation mode shifts to a longer wavelength side by 2 [nm]. Furthermore, a slight increase was seen in the vicinity of 398 [nm].

As illustrated in part (B) of FIG. 18, when the maximum voltage value Vmax of the drive voltage pulse DJw was 17.8 [V], a peak at the top and a slope portion of gradual attenuation were seen in a waveform LT14 of laser light LL. Also, as illustrated in part (A) of FIG. 18, two high peaks were seen at about 398 [nm] and at about 403 [nm] in its spectrum ST14. In the spectrum ST14, the peak at about 408 [nm] is much lower than in the spectrum ST13 (part (B) of FIG. 17), but a high peak was seen at about 398 [nm].

As illustrated in part (B) of FIG. 19, when the maximum voltage value Vmax of the drive voltage pulse DJw was 38.4 [V], a peak at the top and a slope portion of gradual attenuation were definitely seen in a waveform LT15 of laser light LL. Also, as illustrated in part (A) of FIG. 19, two peaks were seen at about 398 [nm] and at about 404 [nm] in its spectrum ST15. In the spectrum ST15, compared to the spectrum ST14 (part (B) of FIG. 18), the peak at about 408 [nm] completely disappears, and a definite peak was seen at about 398 [nm].

Accordingly, it was determined that the short-pulse light source 1 outputs laser light LL having a waveform and a wavelength different from those of oscillation output light LMp when the semiconductor laser 3 is supplied with a drive voltage pulse DJw having the specific voltage value β (that is, the maximum voltage value Vmax) larger than the oscillation voltage value α. Also, the emission start time τd did not match equation (3) obtained from the foregoing rate equation.

Here, attention is focused on the wavelength of laser light LL. The laser light LL changes to normal output light LNp (FIG. 15) and to oscillation output light LMp (FIG. 16) as the maximum voltage value Vmax increases. Furthermore, the wavelength thereof changes from that of the oscillation output light LMp.

Specifically, as illustrated in FIG. 16, the oscillation output light LMp has a peak that is about 3 [nm] (within 3±2 [nm]) from the peak of the normal output light LNp on the longer wavelength side, in addition to a peak at almost the same wavelength as that of the normal output light LNp (within ±2 [nm] of the wavelength of the normal output light LNp).

On the other hand, the laser light LL illustrated in FIG. 19 has a peak that is about 6 [nm] (within 6±2 [nm]) from the peak of the normal output light LNp on the shorter wavelength side, in addition to a peak at almost the same wavelength as that of the normal output light LNp (within ±2 [nm] of the wavelength of the normal output light LNp). Hereinafter, such laser light LL is called specific output light LAp, and the mode of the semiconductor laser 3 for outputting the specific output light LAp is called a specific mode.

Here, when the laser light LL having a maximum voltage value Vmax of 15.6 [V] (part (A) of FIG. 17) is compared with the laser light LL of 17.8 [V] (part (A) of FIG. 18), the peak on the longer wavelength side does not exist, but the peak on the shorter wavelength side exists. That is, during a process in which laser light LL changes from oscillation output light LMp to specific output light LAp in accordance with a rise of the maximum voltage value Vmax, the peak on the longer wavelength side gradually attenuates whereas the peak on the shorter wavelength side increases.

Hereinafter, laser light LL in which the peak area on the shorter wavelength side is equal to or larger than the peak area on the longer wavelength side is regarded as specific output light LAp, and laser light LL in which the peak area on the shorter wavelength side is smaller than the peak area on the longer wavelength side is regarded as oscillation output light LMp. In addition, in a case where two peaks overlap as in FIG. 18, the wavelength that is 6 [nm] from the wavelength of the normal output light LNp on the shorter wavelength side is regarded as a center wavelength, and the area in the range of ±3 [nm] of the center wavelength is regarded as the area of the peaks.

Therefore, the laser light LL having a maximum voltage value Vmax of 15.6 [V] (FIG. 17) is oscillation output light LMp, and the laser light LL having a maximum voltage value Vmax of 17.8 [V] (FIG. 18) is specific output light LAp.

Figure 20:
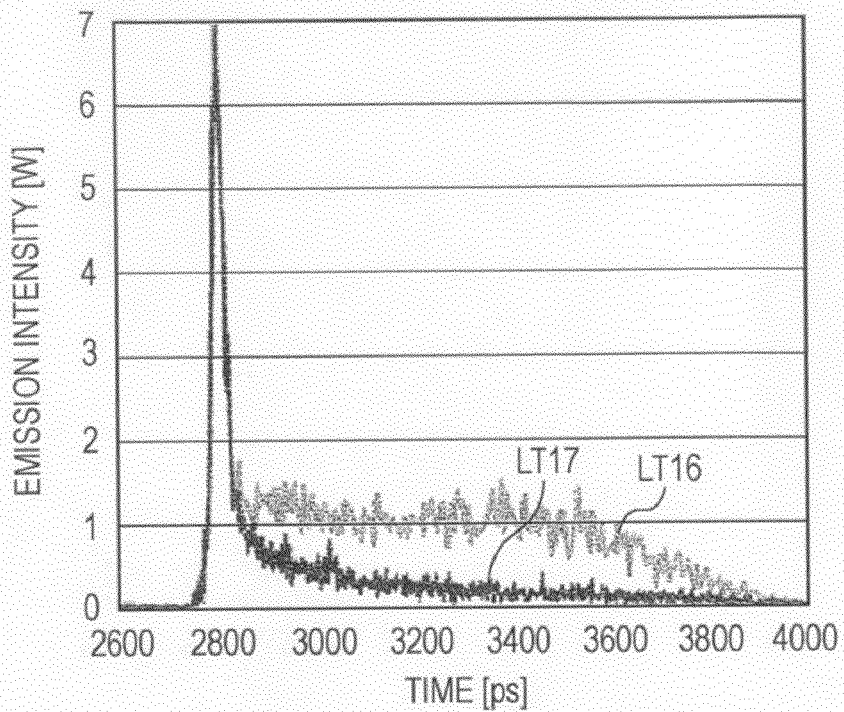
FIG. 20 is a schematic diagram for explaining an effect of a BPF.

As illustrated in FIG. 20, waveforms LT16 and LT17 of laser light LL in the specific mode in cases where the BPF 13 was set and was not set are illustrated. Note that the BPF 13 is configured to decrease the transmittance of light of 406±5 [nm].

According to FIG. 20, in the waveform LT17 in the case where the BPF 13 was set, almost no change was seen in the emission intensity of a specific peak APK compared to the waveform LT16, but the emission intensity of a specific slope ASP significantly decreased. That is, it was determined that, in the specific mode, the specific slope ASP had a wavelength of about 404 [nm], almost the same as in the normal mode, and thus decreased due to the BPF 13, whereas the specific peak APK had a wavelength of about 398 [nm] and thus did not decrease due to the BPF 13.

Figure 21:
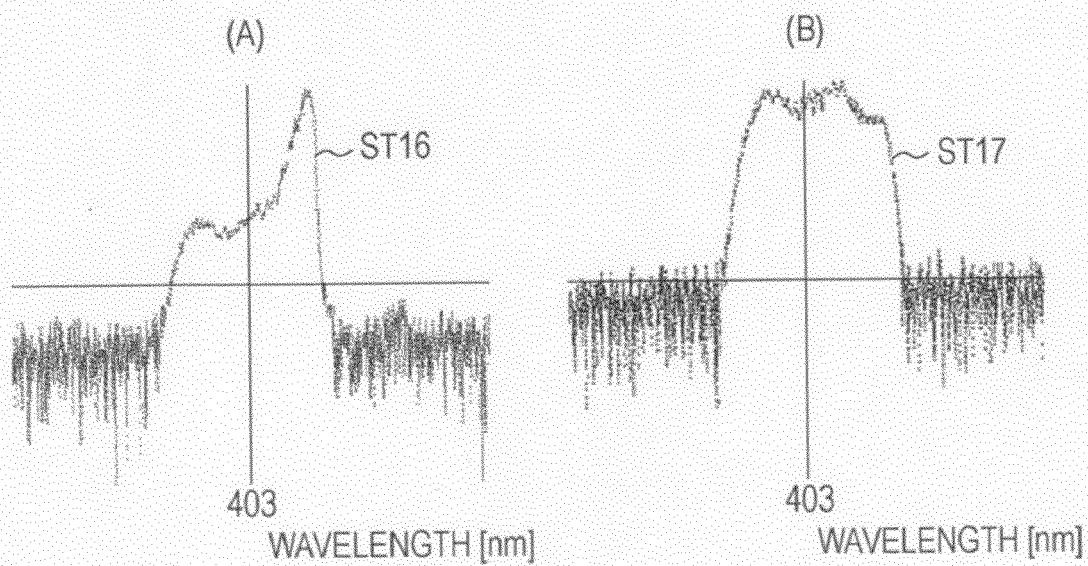
FIG. 21 is a schematic diagram for explaining an effect of a BPF.

FIG. 21 illustrates spectra ST16 and ST17 corresponding to the waveforms LT16 and LT17. Note that the spectra ST16 and ST17 are normalized in accordance with a maximum emission intensity, and that the emission intensity on the vertical axis indicates relative values.

In the spectrum ST16, the light intensity at 404 [nm] was higher than the light intensity at 398 [nm] in accordance with the specific slope ASP having a large area in the waveform LT16. On the other hand, in the spectrum ST17, the light intensity at 404 [nm] was substantially the same as the light intensity at 398 [nm] in accordance with a decrease in the specific slope ASP.

Accordingly, it was determined that, in laser light LL in the specific mode, the wavelength of the specific slope ASP is about 404 [nm] whereas the wavelength of the specific peak APK is about 398 [nm], that is, the wavelength of the specific peak APK is shorter than that of the specific slope ASP.

Laser light LL in the specific mode will be summarized from the above.

Figure 22:
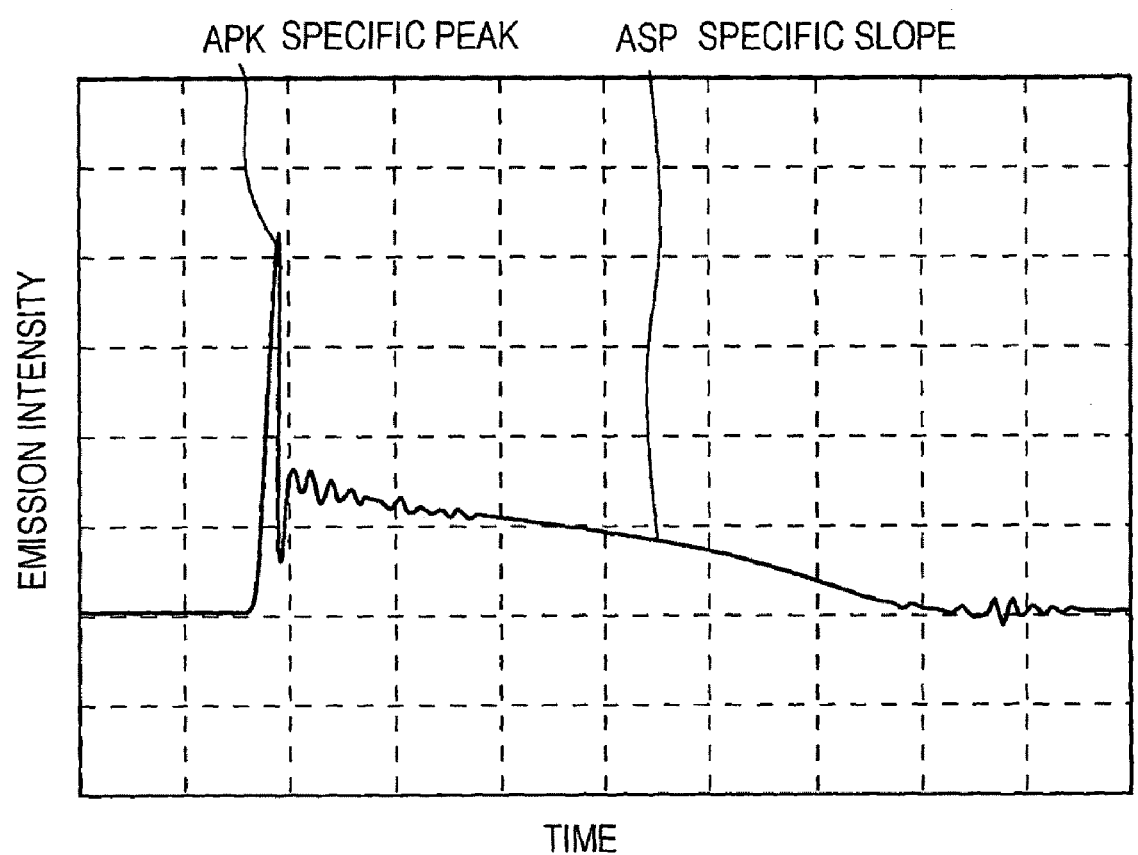
FIG. 22 is a schematic diagram illustrating a waveform of specific output light.

The semiconductor laser 3 shifts to the specific mode when being applied with a laser drive voltage DJ having a specific voltage value β that is larger than a voltage value for causing relaxation oscillation, and emits specific output light LAp having a specific peak APK that appears first and a specific slope ASP that appears next, as illustrated in FIG. 22.

The wavelength of the specific peak APK shifts to the shorter wavelength side by about 6 [nm] compared to the wavelength of laser light LL in the normal mode. Note that a similar result was obtained in a case where a semiconductor laser in which the wavelength of laser light LL in the normal mode is different was used in another experiment.

As a result of measurement using the power meter 14 (SLD3233 made by Sony Corporation was used as the semiconductor laser 3), it was determined that the emission intensity of this specific peak APK is about 12 [W], much higher than the maximum emission intensity of laser light LL in the relaxation oscillation mode (about 1 to 2 [W]). Note that this emission intensity is not shown in the figure because the resolution of the optical sample oscilloscope 16 is low.

Also, as a result of analysis using a streak camera (not illustrated), it was determined that the specific peak APK has a peak width of about 10 [ps], which is smaller than a peak width in the relaxation oscillation mode (about 30 [ps]). Note that this peak width is not shown in the figure because the resolution of the optical sample oscilloscope 16 is low.

Also, in the specific slope ASP, the wavelength thereof was the same as the wavelength of laser light LL in the normal mode, and the maximum emission intensity was about 1 to 2 [W].

Actually, the laser control unit 2 of the short-pulse light source 1 applies, to the semiconductor laser 3, a laser drive voltage DJ having the specific voltage value β larger than the oscillation voltage value α, as a drive voltage pulse DJw.

Accordingly, as illustrated in FIG. 22, the laser control unit 2 can cause the semiconductor laser 3 to shift to the specific mode and to emit specific output light LAp having a very high specific peak APK, as laser light LL.

As described above, the short-pulse light source 1 controls the pulse generator 4 to apply a drive voltage pulse DJw having a voltage value sufficient to shift the semiconductor laser 3 to the specific mode, thereby being able to output specific output light LAp from the semiconductor laser 3.

(1-4) Operation and Effect

In the above described configuration, the short-pulse light source 1 performs control so that a drive voltage pulse DJw in a laser drive voltage DJ has the specific voltage value β larger than the oscillation voltage value α. Accordingly, the short-pulse light source 1 shifts the semiconductor laser 3 to the specific mode, thereby being able to emit specific output light LAp having a specific peak APK of a very high emission intensity.

Also, the short-pulse light source 1 performs control so that the drive voltage pulse DJw has the oscillation voltage value α so as to shift the semiconductor laser 3 to the relaxation oscillation mode, thereby being able to emit oscillation output light LMp having a peak of a first wave of a relatively high emission intensity.

(2) Second Embodiment

In the second embodiment illustrated in FIGS. 23 to 31, the parts corresponding to those in the first embodiment illustrated in FIGS. 1 to 22 are denoted by the same reference numerals. The second embodiment is different from the first embodiment in that a short-pulse light source 51 corresponding to the short-pulse light source 1 corrects a laser drive voltage DJ so as to output laser light LL in a pulsed manner at constant intervals regardless of change in environment or the like.

(2-1) Principle of the Invention

A pulse generator 54 corresponding to the pulse generator 54, the LD driver 5, and the semiconductor laser 3 which are included in the short-pulse light source 51 have a so-called temperature, characteristic in which a characteristic changes in accordance with temperature, and the characteristic changes in accordance with an environmental factor, such as an ambient temperature, and heat generation. Here, the time from a rise of a generated signal pulse SLw in a pulse signal SL to the maximum value of a specific peak APK is defined as a phase φ. Note that, in the figure, the phase φ is larger than an actual phase for easy understanding.

Figure 23:
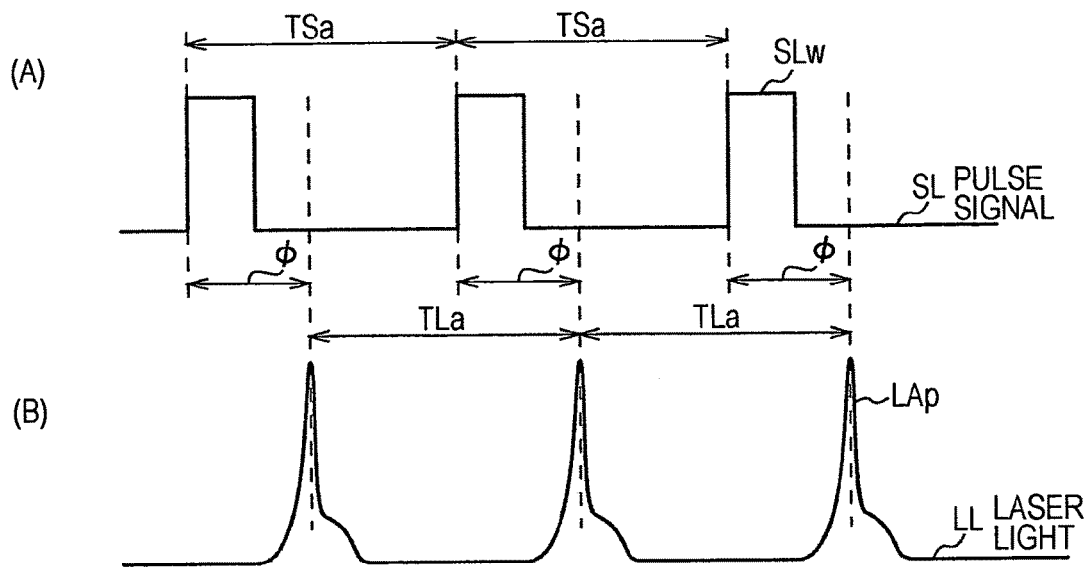
FIG. 23 is a schematic diagram for explaining phases of set pulses and laser light.

As illustrated in FIG. 23, in a case where a pulse signal SL having generated signal pulses SLw with constant set periods TSa is generated by the pulse generator 54, the short-pulse light source 51 can output specific output light LAp in a pulsed manner at constant output periods TLa that are the same as the constant set periods TSa, if the phase φ is constant.

Figure 24:
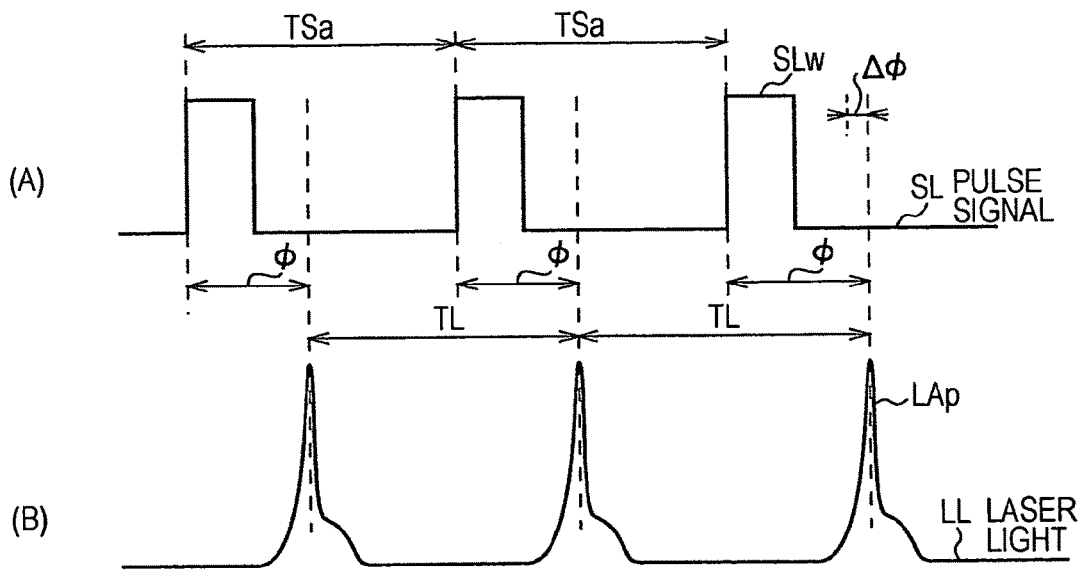
FIG. 24 is a schematic diagram for explaining phase shift of set pulses and laser light.

However, as illustrated in FIG. 24, when a pulse signal SL having generated signal pulses SLw with constant set periods TSa is generated by the pulse generator 54 of the short-pulse light source 51 in a case where the phase φ increases by a variation Δφ, the output of a specific peak APK delays by the variation Δφ, so that output periods TL cannot be constant.

Figure 25:
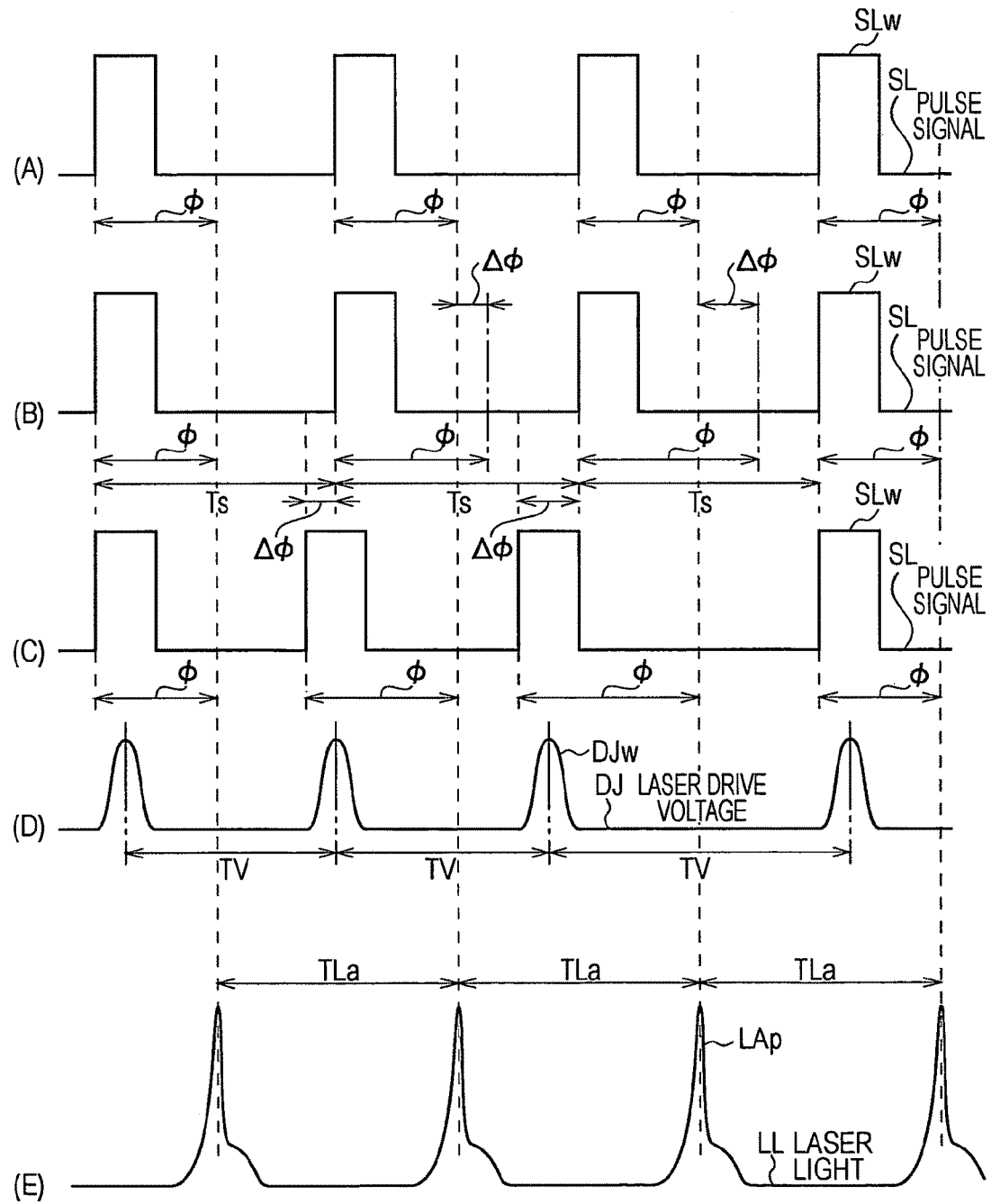
FIG. 25 is a schematic diagram for explaining the principle of the present invention.

Accordingly, in the short-pulse light source 51 according to the second embodiment, set periods TS of the pulse signal SL are varied to offset variations Δφ of phases φ (part (B) of FIG. 25), as illustrated in part (C) of FIG. 25.

Specifically, the pulse generator 54 of the short-pulse light source 51 detects a phase φ and, in a case where the phase φ increases by Δφ, advances the rise of a generated signal pulse SLw in a pulse signal SL by Δφ. On the other hand, in a case where the phase φ decreases by Δφ, the pulse generator 54 delays the rise of a generated signal pulse SLw by Δφ.

As a result, as illustrated in part (D) of FIG. 25, voltage periods TV of drive voltage pulses DJw in a laser drive voltage DJ are varied to offset the phase φ in the short-pulse light source 51, as in the pulse signal SLw. Accordingly, the short-pulse light source 51 can output specific peaks APK in a pulsed manner at constant output periods TLa from the semiconductor laser 3.

Additionally, a description has been given about a case of outputting specific output light LAp in a pulsed manner in FIG. 25, but the same can be applied to a case of outputting oscillation output light LMp. Note that specific output light LAp and oscillation output light LMp will be collectively called pulsed light hereinafter.

As described above, in the short-pulse light source 51, a laser drive voltage DJ is corrected by varying voltage periods TV of drive voltage pulses DJw so as to offset a variation in phase φ due to a change of environment or the like, whereby laser light LL can be output in a pulsed manner at constant output periods TLa from the semiconductor laser 3.

(2-2) Control of Emission Intervals

Figure 26:
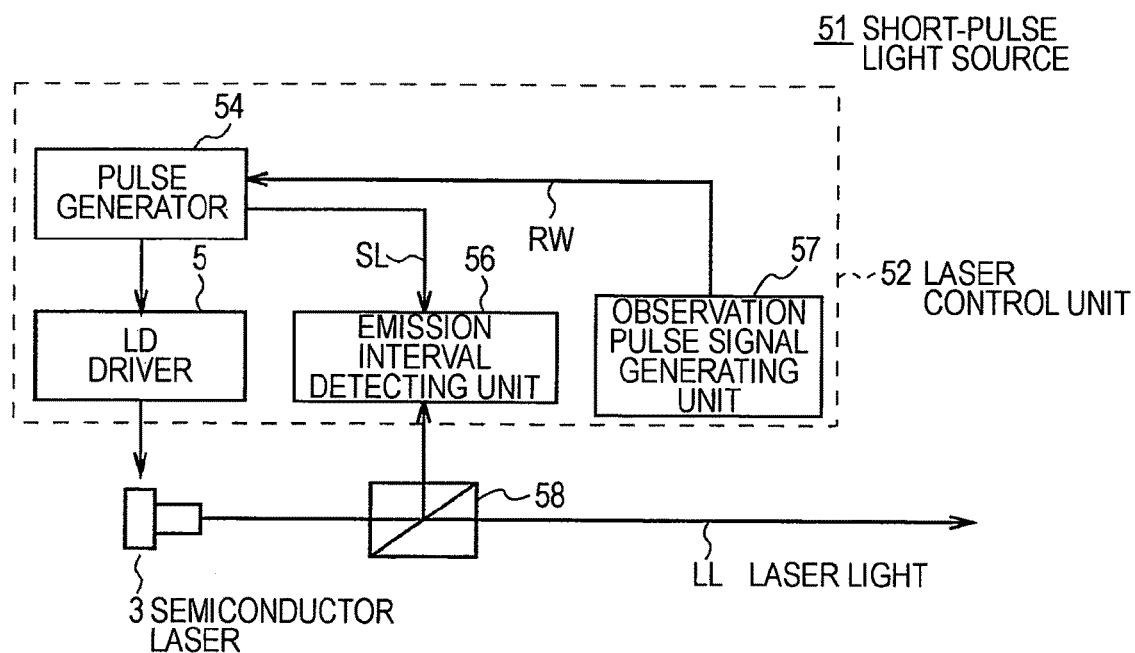
FIG. 26 is a schematic diagram illustrating a short-pulse light source according to a second embodiment.

As illustrated in FIG. 26, the short-pulse light source 51 is different from the short-pulse light source 51 in that a laser control unit 52 corresponding to the laser control unit 2 has an emission interval detecting unit 56 and an observation pulse signal generating unit 57 and that the configuration of the pulse generator 54 corresponding to the pulse generator 54 is different.

In the short-pulse light source 51, an emission interval control process is executed in which emission intervals (that is, output periods TL) of peaks of first waves in a specific peak APK or oscillation output light LMp are detected from actually-output laser light LL and in which a pulse signal SL is generated so that the output periods TL are constant.

Figure 27:
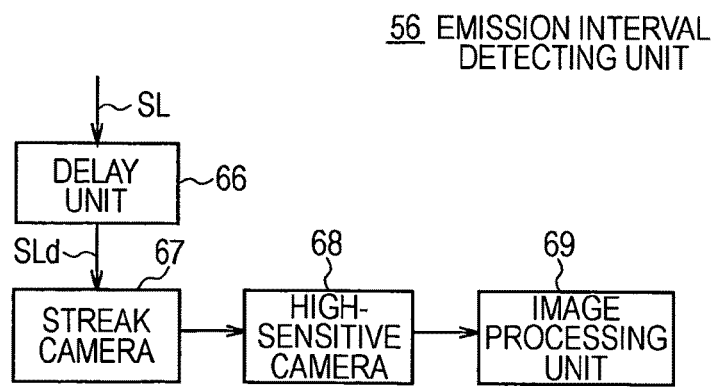
FIG. 27 is a schematic diagram illustrating a configuration of an emission interval detecting unit.

As illustrated in FIG. 27, a beam splitter 58 that transmits and reflects laser light with a predetermined ratio causes part of laser light LL emitted from the semiconductor laser 3 to enter the emission interval detecting unit 56.

The emission interval detecting unit 56 supplies a pulse signal SL supplied from the pulse generator 54 to a delay unit 66. The delay unit 66 delays the pulse signal SL by a predetermined time to generate a delayed pulse signal SLd and supplies it to a streak camera 67.

The streak camera 67 executes streak sweep using a rise of the delayed pulse signal SLd as a trigger to capture a streak image. This streak image cannot be held in the streak camera 67 and thus capturing is performed by a high-sensitive camera 68. The high-sensitive camera 68 supplies captured image data to an image processing unit 69.

Figure 28:
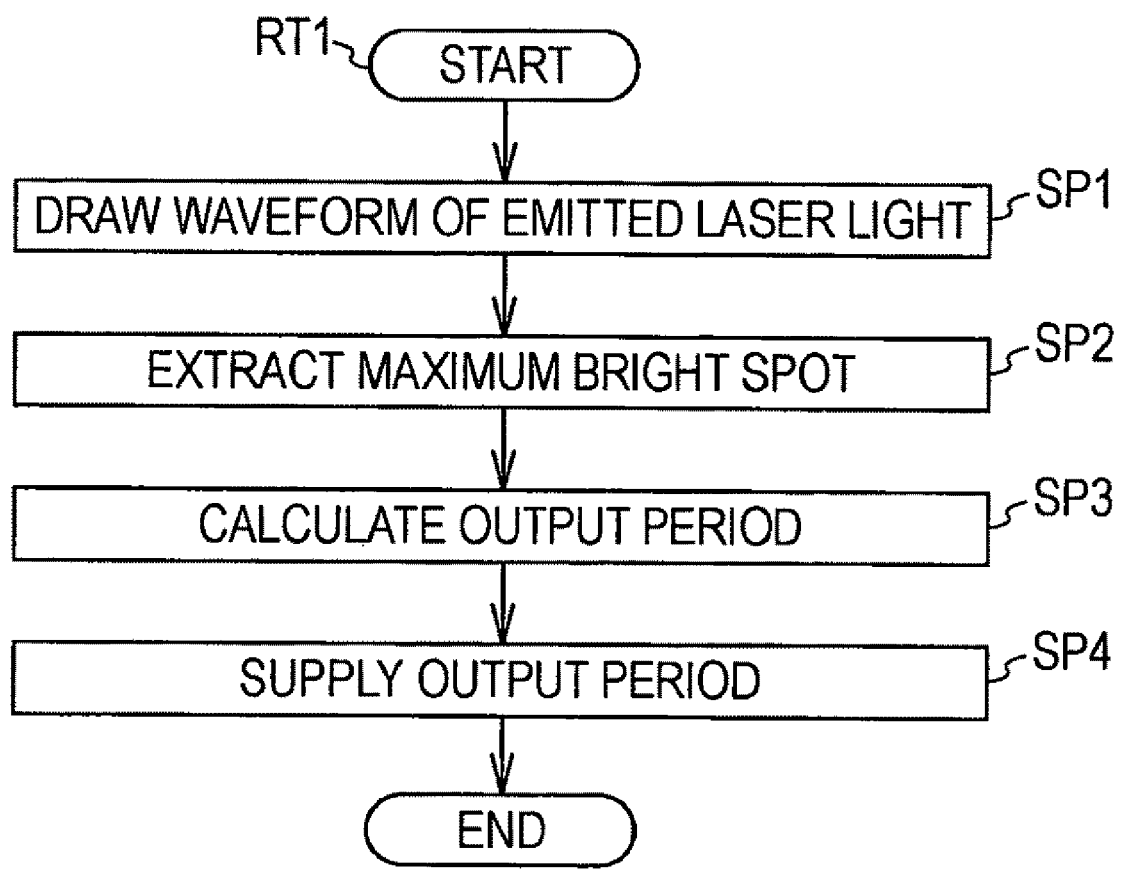
FIG. 28 is a flowchart for explaining generation of observation pulses.
Figure 29:
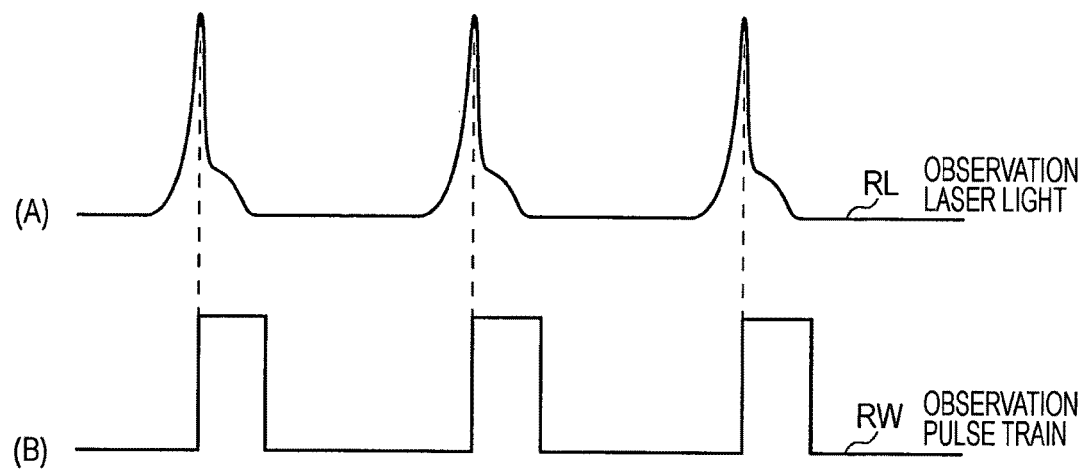
FIG. 29 is a schematic diagram for explaining generation of observation pulses.

As illustrated in FIG. 28, the image processing unit 69 starts an emission interval detection process procedure RT1, draws observation laser light RL representing a relationship between emission intensity of laser light LL and time on the basis of image data as illustrated in part (A) of FIG. 29, and then moves to the next step SP2.

In step SP2, the image processing unit 69 extracts a maximum bright spot from the observation laser light RL, moves to step SP3 to calculate an output period TL serving as a bright spot interval between the previous maximum bright spot and the maximum bright spot detected this time, and then moves to the next step SP4. In step SP4, the image processing unit 69 supplies the output period TL to the observation pulse signal generating unit 57 and ends the process.

The observation pulse signal generating unit 57 generates an observation pulse train RW (part (B) of FIG. 29) that rises at output periods TL on the basis of the output period TL and supplies it to the pulse generator 44.

Figure 30:
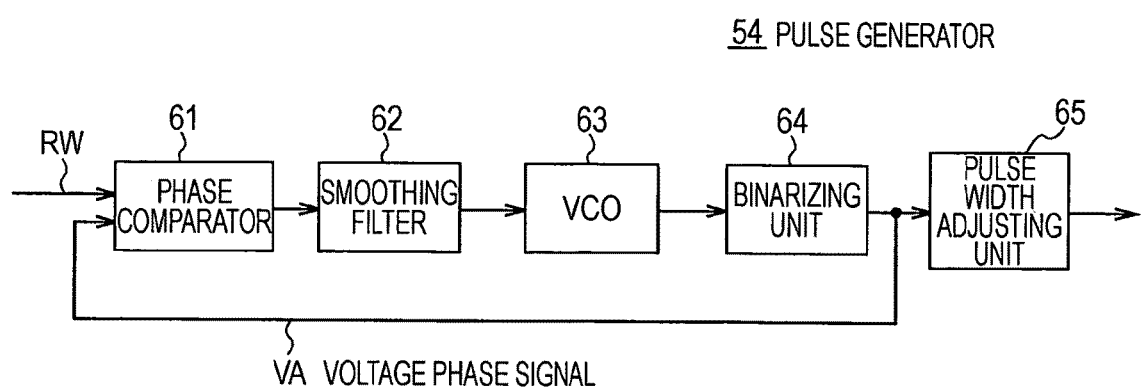
FIG. 30 is a schematic diagram illustrating a configuration of a pulse generator according to the second embodiment.
Figure 31:
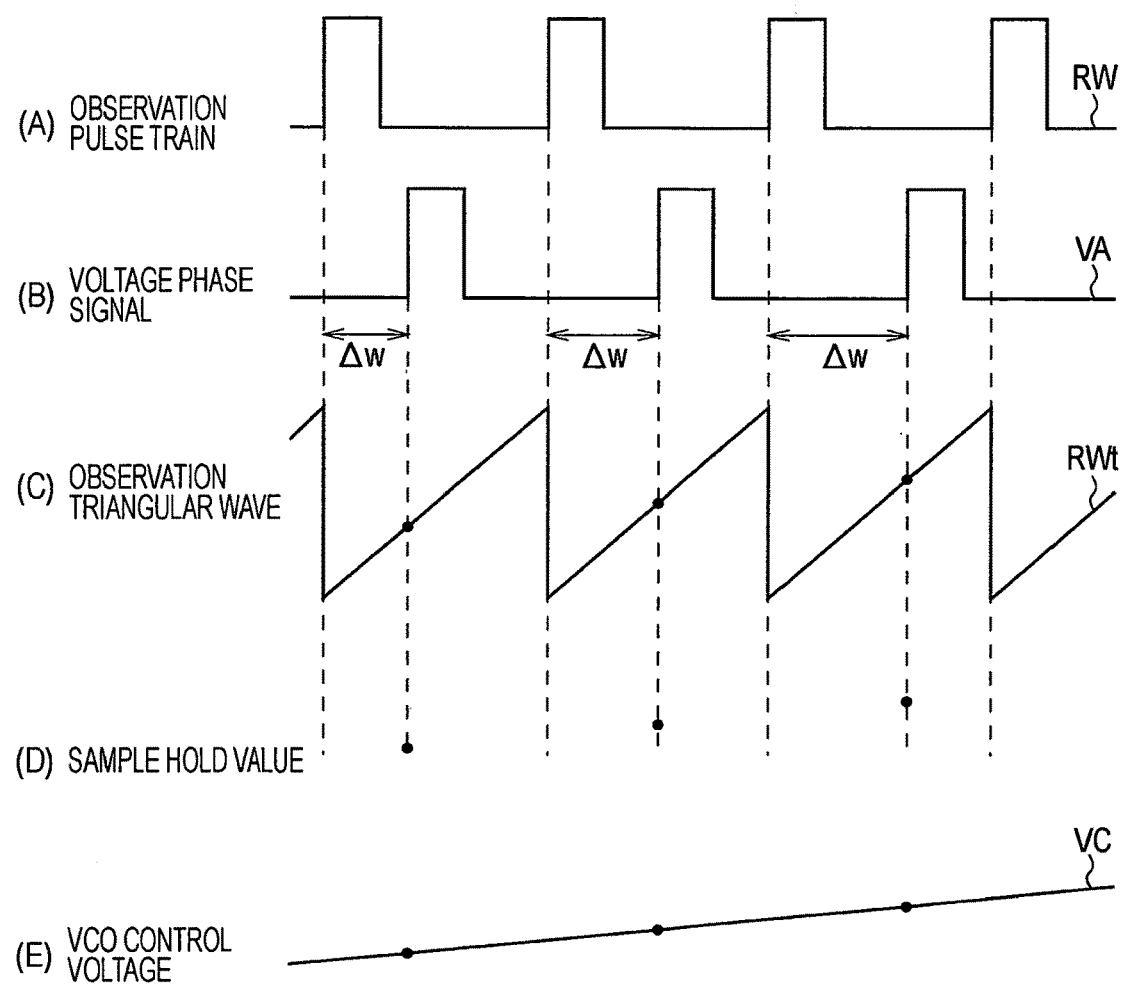
FIG. 31 is a schematic diagram for explaining generation of a VCO control voltage.

As illustrated in FIG. 30, in the pulse generator 44, an observation pulse train RW that represents output periods TL of pulsed light that has just been detected is supplied to a phase comparator 61. As illustrated in FIG. 31, the phase comparator 61 compares the phases of the observation pulse train RW (part (A) of FIG. 31) and a voltage phase signal VA (part (B) of FIG. 31).

Here, the voltage phase signal VA is a signal serving as a base of a pulse signal SL. That is, the voltage phase signal VA represents set periods TS of a current pulse signal SL, that is, voltage periods TV of a current laser drive voltage DJ. Also, the observation pulse train RW represents the periods of pulsed light that has already been output, that is, output periods TL of pulsed light that has actually been output.

The phase comparator 61 generates an observation triangular wave RWt (part (C) of FIG. 31) using a rise of the observation pulse train as a trigger, for example. The phase comparator 61 holds the value of the observation triangular wave RWt at a rise timing of the voltage phase signal VA, and supplies the value, serving as a sample hold value, to a smoothing filter 62.

That is, the phase comparator 61 defines a value based on a phase difference $\Delta W$ between the observation pulse train RW and the voltage phase signal VA as a sample hold value. Here, the observation pulse train RW and the voltage phase signal VA are constantly staggered by a predetermined delay time. Thus, the sample hold value is always constant when the phase difference $\Delta W$ is constant. However, when a phase $\phi$ shifts from a phase that is assumed in the observation pulse train RW, the phase difference $\Delta W$ between the observation pulse train RW and the voltage phase signal VA varies, so that the sample hold value changes.

In other words, the observation pulse train RW (that is, output periods TL of laser light LL) can be made substantially constant by changing the frequency of a pulse signal SL so that the phase difference $\Delta W$ is always constant.

Therefore, the phase comparator 61 supplies the sample hold value to the smoothing filter 62. The smoothing filter 62 smoothes the sample hold value to generate a VCO control voltage VC and supplies it to a VCO 63.

The VCO 63 generates a frequency signal having a frequency according to the VCO control voltage VC and supplies it to a binarizing unit 64. At this time, the VCO 63 varies the frequency of the frequency signal in accordance with the phase difference $\Delta W$. This frequency is preset to offset the phase difference $\Delta W$.

The binarizing unit 64 binarizes the frequency signal to generate a voltage phase signal VA, supplies it to the phase comparator 61, and also supplies it to a pulse width adjusting unit 65. The pulse width adjusting unit 65 adjusts the pulse width of the voltage phase signal VA and supplies it as a pulse signal SL to the LD driver 5.

The LD driver 5 generates a laser drive voltage DJ on the basis of the pulse signal SL and supplies it to the semiconductor laser 3. The semiconductor laser 3 is configured to output laser light LL in a pulsed manner in accordance with the laser drive voltage DJ.

That is, in a case where the phase difference $\Delta W$ increases and the VCO control voltage VC has a large value due to an increase in phase $\phi$, the VCO 63 increases the frequency of a frequency signal.

As a result, the short-pulse light source 51 can reduce periods of a voltage phase signal VA and set small set periods TS of a pulse signal SL. Accordingly, the short-pulse light source 51 can reduce voltage periods TV of a laser drive voltage DJ, so that the emission timing of pulsed light can be advanced in accordance with an increase in phase $\phi$.

Also, in a case where the phase difference $\Delta W$ decreases and the VCO control voltage VC has a large value due to a decrease in phase $\phi$, the VCO 63 decreases the frequency of a frequency signal.

As a result, the short-pulse light source 51 can reduce periods of a voltage phase signal VA and set large set periods TS of a pulse signal SL. Accordingly, the short-pulse light source 51 can increase voltage periods TV of a laser drive voltage DJ, so that the emission timing of pulsed light can be delayed in accordance with a decrease in phase $\phi$.

In this way, the short-pulse light source 51 adjusts voltage periods TV of a laser drive voltage DJ so as to offset variations in phase $\phi$, thereby being able to emit pulsed light at constant output periods TLa from the semiconductor laser 3.

(2-3) Operation and Effect

In the above-described configuration, the short-pulse light source 51 emits pulsed light, which is pulse-shaped laser light LL, from the semiconductor laser 3, and applies a laser drive voltage DJ that is generated on the basis of a pulse signal SL and that has pulse-shaped drive voltage pulses DJw to the semiconductor laser 3. At this time, the short-pulse light source 51 varies a set period TS corresponding to an interval between generated signal pulses SLw in the pulse signal SL, thereby varying a voltage period TV corresponding to an interval between the drive voltage pulses DJw.

Accordingly, the short-pulse light source 51 can adjust an output period TL of pulsed light and offset variations in phase φ, which is a time difference between a generated signal pulse SLw and pulsed light, the time difference occurring in accordance with a surrounding environment or the like.

Also, the short-pulse light source 51 adjusts the set period TS to offset variations in phase φ from a rise of a generated signal pulse SLw to pulsed light, thereby adjusting the voltage period TV to offset variations in phase from when drive voltage pulses DJw are started to be applied to when pulsed light is emitted. Accordingly, the short-pulse light source 51 can emit pulsed light at constant output periods Ta regardless of variations in phase φ due to a change of environment or the like.

Furthermore, the short-pulse light source 51 detects an output period TL of pulsed light, and varies a voltage period TV of a laser drive voltage DJ that is newly generated on the basis of a phase difference ΔW, which represents a difference between a voltage period TV of a laser drive voltage DJ that was generated immediately before and the output period TL.

Here, the phase difference ΔW, which is a difference between a voltage period TV of an actually-applied laser drive voltage DJ and an output period TL of actually-output pulsed light, is generated in accordance with a temporal certain phase difference between the voltage period TV and the output period TL and the phase φ, and changes only in accordance with variations in phase φ.

Therefore, the short-pulse light source 51 can offset a phase φ by varying the voltage period TV of a laser drive voltage DJ on the basis of the phase difference ΔW and make the output period TL of pulsed light constant. At this time, the short-pulse light source 51 can feed back a result of the output period TL of actually-output pulsed light to a laser drive voltage DJ that is to be newly generated, thereby being able to control the output period TL at high precision.

Also, the short-pulse light source 51 has a streak camera, thereby being able to precisely detect a maximum value of specific output light LAp having a peak width of about 10 [ps] and precisely calculate the output period TL.

Furthermore, the short-pulse light source 51 generates a VCO control voltage VC, serving as a control voltage having a control voltage value based on a phase difference ΔW between the voltage period TV of a laser drive voltage DJ that was generated immediately before and the output period TL. Also, the short-pulse light source 51 generates a voltage phase signal VA having a frequency based on the control voltage value and generates a laser drive voltage DJ on the basis of the voltage phase signal VA. Accordingly, the short-pulse light source 51 can compare the voltage period TV of the laser drive voltage DJ that was generated immediately before with the output period TL of the laser light LL that was actually output.

Also, the short-pulse light source 51 emits specific output light LAp, serving as pulsed light, having a pulse-shaped specific peak APK and a specific slope ASP, the emission intensity of the specific slope ASP being lower than that of the specific peak APK.

Accordingly, the short-pulse light source 51 can emit specific output light LAp having a specific peak APK with a very high emission intensity.

According to the above-described configuration, the short-pulse light source 51 varies a voltage period TV corresponding to an interval between drive voltage pulses DJw by varying a set period TS, thereby adjusting an output period TL of pulsed light. Accordingly, the short-pulse light source 51 can freely adjust the output period TL of pulsed light regardless of a change of environment or the like.

Accordingly, the present invention can realize a laser light emission method and a short-pulse light source that are capable of controlling output of pulses from a semiconductor laser, and an optical device, an optical disc device, and an optical pickup that use the short-pulse light source.

(3) Third Embodiment

In the third embodiment illustrated in FIGS. 32 to 38, the parts corresponding to those in the second embodiment illustrated in FIGS. 23 to 31 are denoted by the same reference numerals. The third embodiment is different from the first embodiment in that a short-pulse light source 71 (not illustrated) corresponding to the short-pulse light source 51 is used in an optical disc device 110, and the configuration of a pulse generator 74 corresponding to the pulse generator 54 is different.

(3-1) Configuration of Optical Disc

First, a configuration of an optical disc 100 will be described. In this embodiment, information is recorded on the optical disc 100 by irradiating the optical disc 100 with an information light beam LM serving as laser light LL emitted from the optical disc device 110. Also, information is read from the optical disc 100 by detecting a reflected information light beam LMr, which is generated when the information light beam LM is reflected.

Actually, the optical disc 100 is substantially disc-shaped as a whole, and a hole portion 100H for chacking is provided at the center thereof. Also, as illustrated in the cross-sectional view in FIG. 32, the optical disc 100 has a configuration in which both surfaces of a recording layer 101 for recording information are sandwiched by substrates 102 and 103.

The optical disc device 110 focuses an information light beam LM emitted from a light source into the recording layer 101 of the optical disc 100 using an objective lens 118. In a case where this information light beam LM has a relatively high recording intensity, a recording mark RM is formed at the position of a focal point FM in the recording layer 101.

Also, the optical disc 100 is further provided with a servo layer 104 between the recording layer 101 and the substrate 102. Pregrooves for servo are formed on the servo layer 104. Specifically, spiral tracks (hereinafter these are called servo tracks) STR are formed of lands and grooves similar to those in a typical BD (Blu-ray Disc, registered trademark)-R (Recordable) disc or the like.

Addresses composed of a series of numbers are assigned to the servo tracks STR by a predetermined unit of recording, so that a servo track that should be irradiated with a servo light beam LS (hereinafter this is called a target servo track TSG) for recording or reproducing information can be specified using an address.

In addition, pits or the like may be formed on the servo layer 104 (that is, the boundary surfaces between the recording layer 101 and the substrate 102) instead of the pregrooves. Alternatively, pregrooves and pits or the like may be used in combination. Also, the tracks on the servo layer 104 may be concentric, not spiral.

Also, the servo layer 104 is configured to reflect a red light beam having a wavelength of about 660 [nm] at a high reflectance, and transmit a blue-violet light beam having a wavelength of about 404 [nm] at a high transmittance, for example.

The optical disc device 110 irradiates the optical disc 100 with a servo light beam LS having a wavelength of about 660 [nm]. At this time, the servo light beam LS is reflected by the servo layer 104 of the optical disc 100 to become a reflected servo light beam LSr.

The optical disc device 110 receives the reflected servo light beam LSr and, on the basis of a result of the reception, controls the position of the objective lens 118 so that the objective lens 118 moves close to or away from the optical disc 100 in a focus direction, thereby adjusting the focal point FS of the servo light beam LS onto the servo layer 104.

At this time, the optical disc device 110 causes optical axes XL of the servo light beam LS and the information light beam LM to substantially match each other. Accordingly, the optical disc device 110 causes the focal point FM of the information light beam LM to position at a portion corresponding to a target servo track TSG in the recording layer 101, that is, on a normal line that passes the target servo track TSG and that is vertical to the servo layer 104.

The recording layer 101 contains a two-photon absorbing material for absorbing two photons in light of 404 [nm]. It is known that this two-photon absorbing material causes two-photon absorption in proportion to the square of a light intensity and causes two-photon absorption only for light of very high intensity. Note that a hexadiyne compound, a cyanine dye, a merocyanine dye, an oxonol dye, a phthalocyanine dye, an azo dye, and the like can be used as the two-photon absorbing material.

When the recording layer 101 is irradiated with an information light beam LM having a relatively strong intensity, the two-photon absorbing material is vaporized through two-photon absorption, for example, so as to form air bubbles, whereby a recording mark RM is recorded at the position of the focal point FM. Alternatively, the recording mark RM may be formed by changing a local refractive index by causing a chemical reaction or the like in the recording layer 101.

Here, it is known that a two-photon absorbing material reacts in proportion to the square of light intensity. That is, the recording layer 101 reacts by absorbing only an information light beam LM having a very high intensity, and thus the transmittance of the recording layer 101 can be kept high.

In addition, the recording mark RM that is formed in the above-described manner is planarly placed in substantially parallel with a first surface 100A of the optical disc 100 and the individual surfaces of the servo layer 104 and the like, so as to form a mark layer Y of the recording mark RM.

On the other hand, the optical disc device 110 focuses an information light beam LM onto a target position PG from the first surface 100A side, for example, when reproducing information from the optical disc 100. Here, in a case where a recording mark RM is formed at the position of the focal point FM (that is, the target position PG), the information light beam LM is reflected by the recording mark RM, and a reflected information light beam LMr is emitted from the recording mark RM.

The optical disc device 110 generates a detection signal in accordance with a detection result of the reflected information light beam LMr and detects whether a recording mark RM is formed on the basis of the detection signal.

As described above, according to this embodiment, in a case where the optical disc device 110 records and reproduces information on/from the optical disc 100, the optical disc device 110 irradiates a target position PG with an information light beam LM also using a servo light beam LS, thereby recording and reproducing desired information.

(3-2) Optical Disc Device (3-2-1) Configuration of Optical Disc Device

Next, a specific configuration of the optical disc device 110 will be described.

Figure 33:
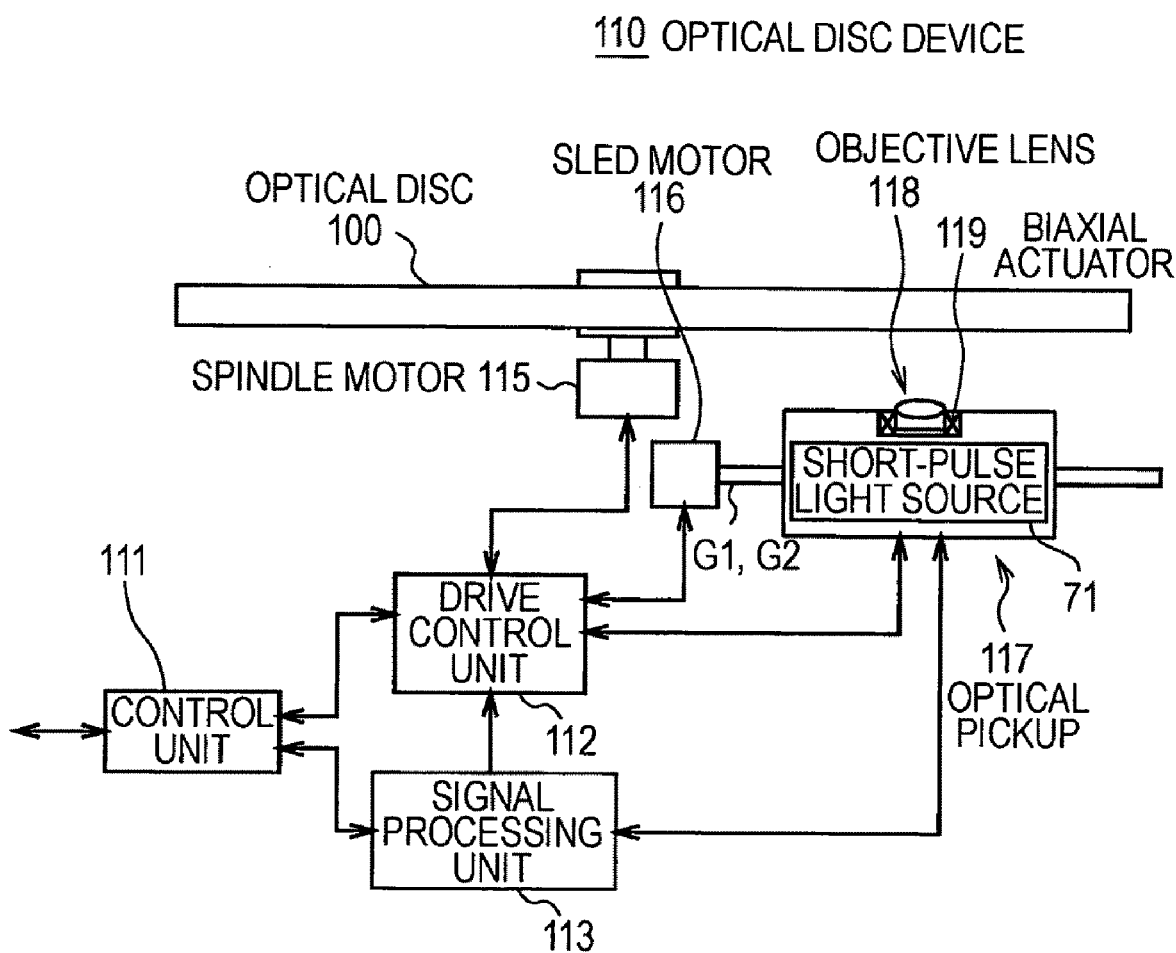
FIG. 33 is a schematic diagram illustrating an entire configuration of an optical disc device.

As illustrated in FIG. 33, the optical disc device 110 is configured with a control unit 111 serving as a center. The control unit 111 includes a CPU (Central Processing Unit), a ROM (Read Only Memory) for storing various programs and the like, and a RAM (Random Access Memory) used as a work memory for the CPU (not illustrated), which are not illustrated.

In a case of recording information on the optical disc 100, the control unit 111 causes a spindle motor 115 to be driven to rotate via a drive control unit 112, so as to rotate the optical disc 100 placed on a turn table (not illustrated) at a desired speed.

Also, the control unit 111 causes a sled motor 116 to drive via the drive control unit 112, so as to move an optical pickup 117 in a tracking direction along movement axes G1 and G2, that is, in a direction toward an inner circumference side or an outer circumference side of the optical disc 100 in a wide range.

The optical pickup 117 is attached with a plurality of optical components, such as the objective lens 118, irradiates the optical disc 100 with an information light beam LM and a servo light beam LS on the basis of control performed by the control unit 111, and detects a reflected servo light beam LSr, which is generated when a servo light beam LS is reflected.

The optical pickup 117 generates a plurality of detection signals based on a detection result of the reflected servo light beam LSr and supplies them to a signal processing unit 113. The signal processing unit 113 performs a predetermined computation process using the detection signals supplied thereto so as to generate a focus error signal SFE and a tracking error signal STE, and supplies them to the drive control unit 112.

Note that the focus error signal SFE is a signal indicating a deviation amount in a focus direction of a servo light beam LS with respect to the servo layer 104. On the other hand, the tracking error signal STE is a signal indicating a deviation amount in a tracking direction of a servo light beam LS with respect to a target servo track STR (hereinafter this is called a target servo track STG).

The drive control unit 112 generates a focus drive signal and a tracking drive signal for driving the objective lens 118 on the basis of the focus error signal SFE and the tracking error signal STE supplied thereto, and supplies them to a biaxial actuator 119 of the optical pickup 117.

The biaxial actuator 119 of the optical pickup 117 performs focus control and tracking control of the objective lens 118 on the basis of the focus drive signal and the tracking drive signal, thereby causing the focal point FS of the servo light beam LS that is focused by the objective lens 118 to track the target servo track STG of a target mark layer Y (hereinafter this is called a target mark layer YG).

At this time, the control unit 111 supplies recording information supplied from the outside to the signal processing unit 113. The signal processing unit 113 generates recording data by performing a predetermined modulation process or the like on the recording information and supplies the recording data to a laser control unit 121 (FIG. 34) in the short-pulse light source 120. The laser control unit 121 modulates laser light LL on the basis of the recording data to form a recording mark RM at a target position PG on a target mark layer YG (that is, a target track TG), thereby being able to record the information.

Also, in a case of reproducing information from the optical disc 100, the optical pickup 117 causes the focal point FS of a servo light beam LS to track a target servo track STG, as in recording, irradiates a target position PG of a target mark layer YG with a relatively-weak information light beam LM, and detects a reflected information light beam LMr, which is generated when the information light beam LM is reflected, at a portion where a recording mark RM is formed.

The optical pickup 117 generates a detection signal based on a detection result of the reflected information light beam LMr and supplies this to the signal processing unit 113. The signal processing unit 113 performs a predetermined computation process, demodulation process, decoding process, and the like, on the detection signal, thereby being able to reproduce information that is recorded as a recording mark RM on a target track TG on a target mark layer YG.

(3-2-2) Configuration of Optical Pickup

Figure 34:
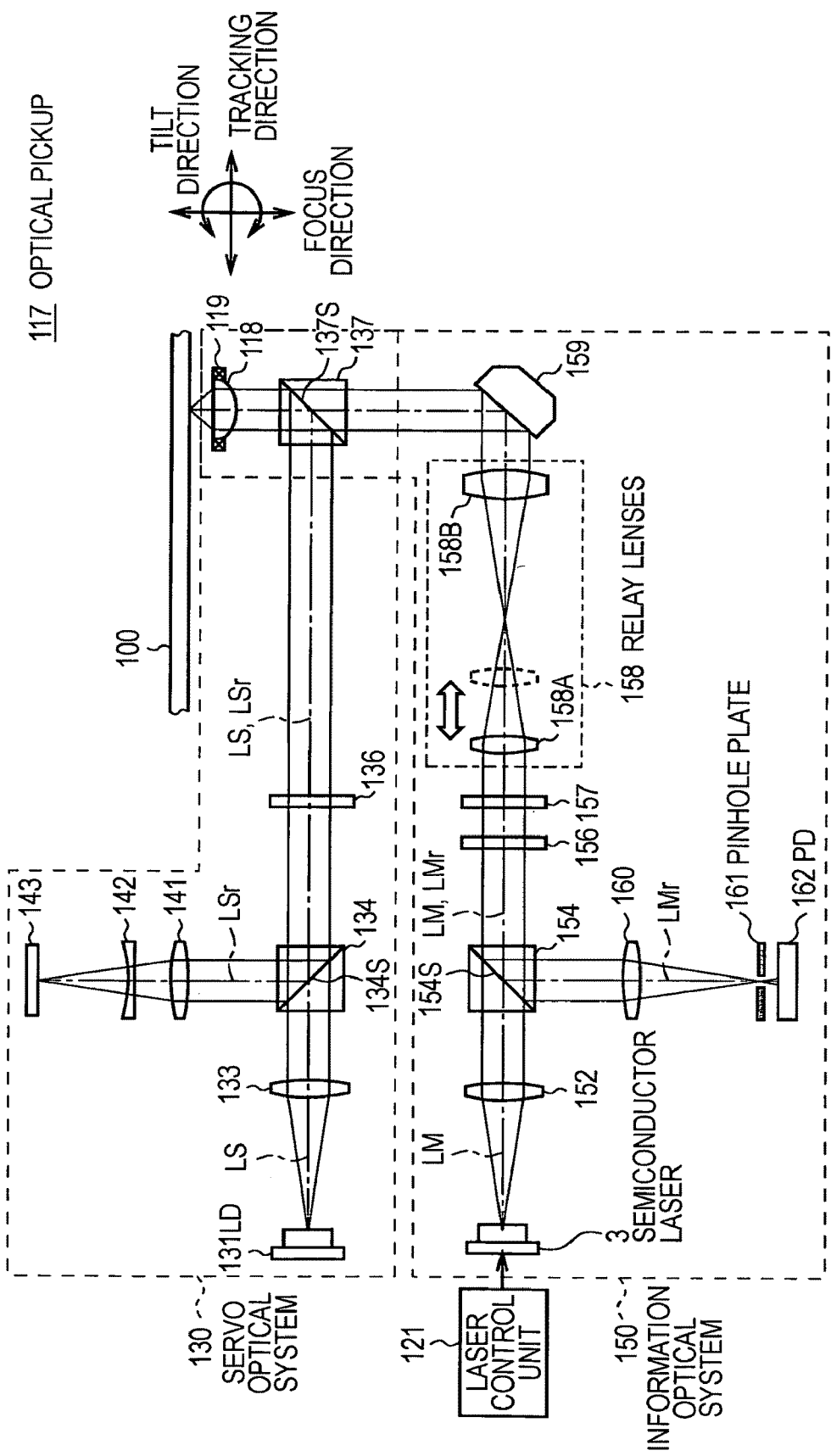
FIG. 34 is a schematic diagram illustrating a configuration of an optical pickup.

Next, a configuration of the optical pickup 117 will be described. As illustrated in FIG. 34, the optical pickup 117 includes a servo optical system 130 for servo control and an information optical system 150 for reproducing or recording information.

In the optical pickup 117, a servo light beam LS serving as servo light emitted from a laser diode 131 and an information light beam LM serving as laser light LL emitted from the semiconductor layer 3 enter the same objective lens 118 via the servo optical system 130 and the information optical system 150, respectively, so that the optical disc 100 is irradiated with those beams.

(3-2-2-1) Optical Path of Servo Light Beam

Figure 35:
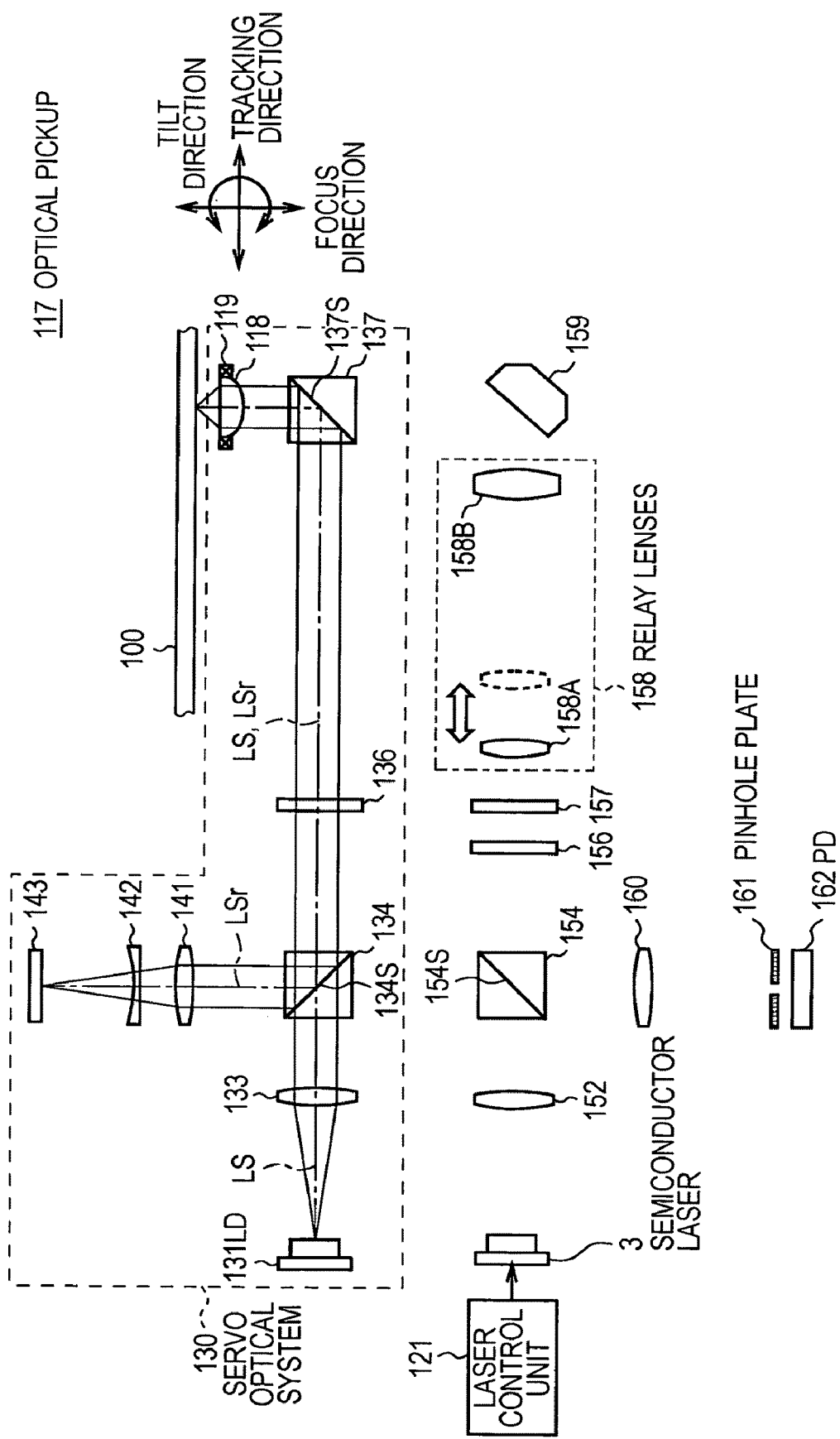
FIG. 35 is a schematic diagram illustrating an optical path of a servo light beam.

As illustrated in FIG. 35, in the servo optical system 130, the optical disc 100 is irradiated with a servo light beam LS via the objective lens 118, and a reflected servo light beam LSr reflected by the optical disc 100 is received by a photodetector 143.

That is, the laser diode 131 emits a predetermined amount of servo light beam LS composed of divergent light on the basis of control performed by the control unit 111 (FIG. 33) and causes the servo light beam LS to enter a collimator lens 133. The collimator lens 133 transforms the servo light beam LS from divergent light into parallel light and causes the light beam to enter a polarizing beam splitter 134.

The polarizing beam splitter 134 causes almost the entire servo light beam LS composed of p-polarized light to transmit therethrough in its polarizing direction, and causes the light beam to enter a quarter-wavelength plate 136.

The quarter-wavelength plate 136 transforms the servo light beam LS composed of p-polarized light into circular polarized light and causes the light beam to enter a dichroic prism 137. The dichroic prism 137 reflects, with a reflection/transmission surface 137S, the servo light beam LS in accordance with the wavelength of the light beam, so as to cause the light beam to enter the objective lens 118.

Figure 32:
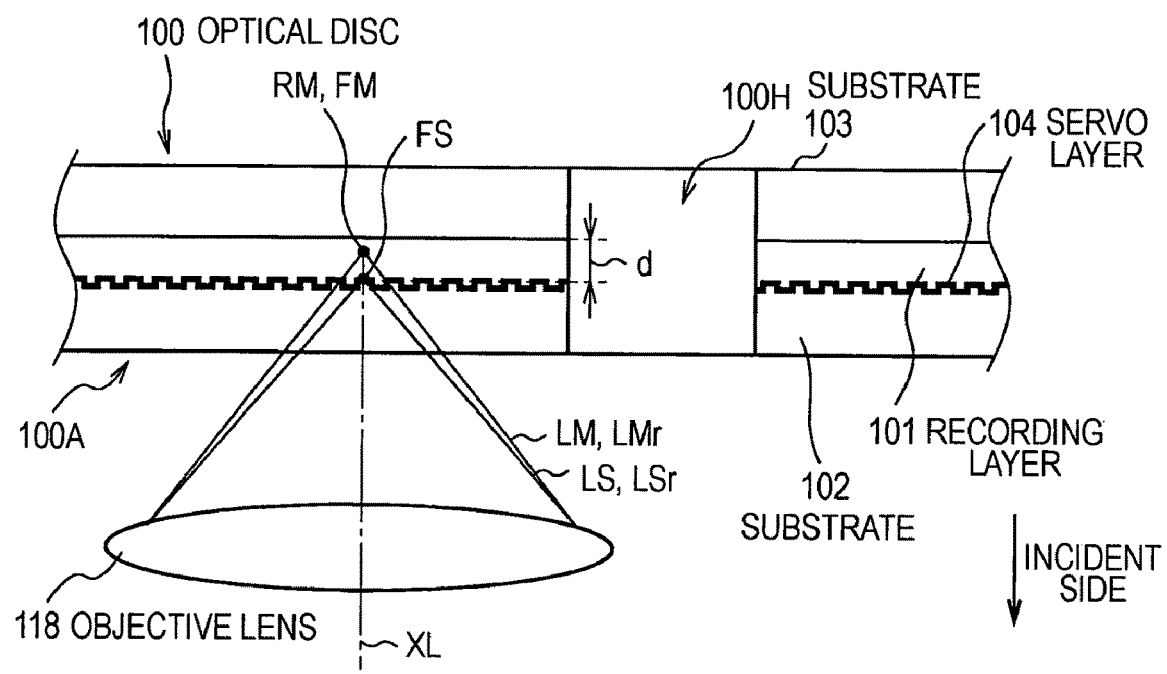
FIG. 32 is a schematic diagram illustrating a configuration of an optical disc.

The objective lens 118 focuses the servo light beam LS and irradiates the servo layer 104 of the optical disc 100 with the light beam. At this time, the servo light beam LS passes through the substrate 102, is reflected by the servo layer 104, and becomes a reflected servo light beam LSr that travels in the opposite direction of the servo light beam LS, as illustrated in FIG. 32.

After that, the reflected servo light beam LSr is transformed into parallel light by the objective lens 118 and enter the dichroic prism 137. The dichroic prism 137 reflects the reflected servo light beam LSr in accordance with the wavelength and causes the light beam to enter the quarter-wavelength plate 136.

The quarter-wavelength plate 136 transforms the reflected servo light beam LSr, which is circular polarized light, into s-polarized light and causes the light beam to enter the polarizing beam splitter 134. The polarizing beam splitter 134 reflects the reflected servo light beam LSr, which is s-polarized light, and causes the light beam to enter a condenser lens 141.

The condenser lens 141 converges the reflected servo light beam LSr and irradiates the photodetector 143 with the reflected servo light beam LSr by causing a cylindrical lens 142 to give astigmatism thereto.

Incidentally, in the optical disc device 110, there is a possibility that axial runout or the like occurs in the optical disc 100 that rotates, and thus there is a possibility that a relative position of a target servo track TSG with respect to the objective lens 118 varies.

For this reason, in order to cause the focal point FS of a servo light beam LS (FIG. 32) to track a target servo track TSG, it is necessary to move the focal point FS in a focus direction, i.e., an approaching direction or a move-away direction with respect to the optical disc 100, and in a tracking direction, i.e., an inner circumference side or an outer circumference side of the optical disc 100.

Therefore, the objective lens 118 can be driven in biaxial directions: the focus direction and tracking direction, by the biaxial actuator 119.

Also, in the servo optical system 130, optical positions of the individual optical components are adjusted so that an in-focus state at the time when a servo light beam LS is focused by the objective lens 118 and when the servo layer 104 of the optical disc 100 is irradiated with the servo light beam LS is reflected in an in-focus state at the time when a reflected servo light beam LSr is focused by the condenser lens 141 and when the photodetector 143 is irradiated with the reflected servo light beam LSr.

The photodetector 143 generates detection signals in accordance with a light amount of a reflected servo light beam LSr and transmits the signals to the signal processing unit 113 (FIG. 33).

That is, the photodetector 143 is provided with a plurality of detection areas (not illustrated) for receiving a reflected servo light beam LSr. The photodetector 143 detects, in the respective plurality of detection areas, respective parts of the reflected servo light beam LSr, generates respective detection signals in accordance with amounts of light detected at this time, and transmits the signals to the signal processing unit 113 (FIG. 33).

The signal processing unit 113 is configured to perform focus control based on a so-called astigmatism method, calculates a focus error signal SFE indicating a deviation amount of the focal point FS of a servo light beam LS with respect to the servo layer 104 of the optical disc 100, and supplies the signal to the drive control unit 112.

Also, the signal processing unit 113 calculates a tracking error signal STE indicating a deviation amount of a focus error signal SFE and the focal point FS with respect to a target servo track TSG in the servo layer 104 of the optical disc 100, and supplies the signal to the drive control unit 112.

The drive control unit 112 generates a focus drive signal on the basis of the focus error signal SFE and supplies the focus drive signal to the biaxial actuator 119, thereby performing feedback control (i.e., focus control) of the objective lens 118 so that the servo light beam LS is focused onto the servo layer 104 of the optical disc 100.

Also, the drive control unit 112 generates a tracking drive signal on the basis of the tracking error signal that is generated using a so-called push-pull method, and supplies the tracking drive signal to the biaxial actuator 119. Accordingly, the drive control unit 112 performs feedback control (i.e., tracking control) of the objective lens 118 so that the servo light beam LS is focused onto a target servo track TSG on the servo layer 104 of the optical disc 100.

As described above, in the servo optical system 130, the servo layer 104 of the optical disc 100 is irradiated with a servo light beam LS, and a reception result of a reflected servo light beam LSr, which is reflected light thereof, is supplied to the signal processing unit 113. Accordingly, the drive control unit 112 performs focus control and tracking control of the objective lens 118 so that the servo light beam LS is focused onto a target servo track TSG on the servo layer 104.

(3-2-2-2) Optical Path of Information Light Beam

Figure 36:
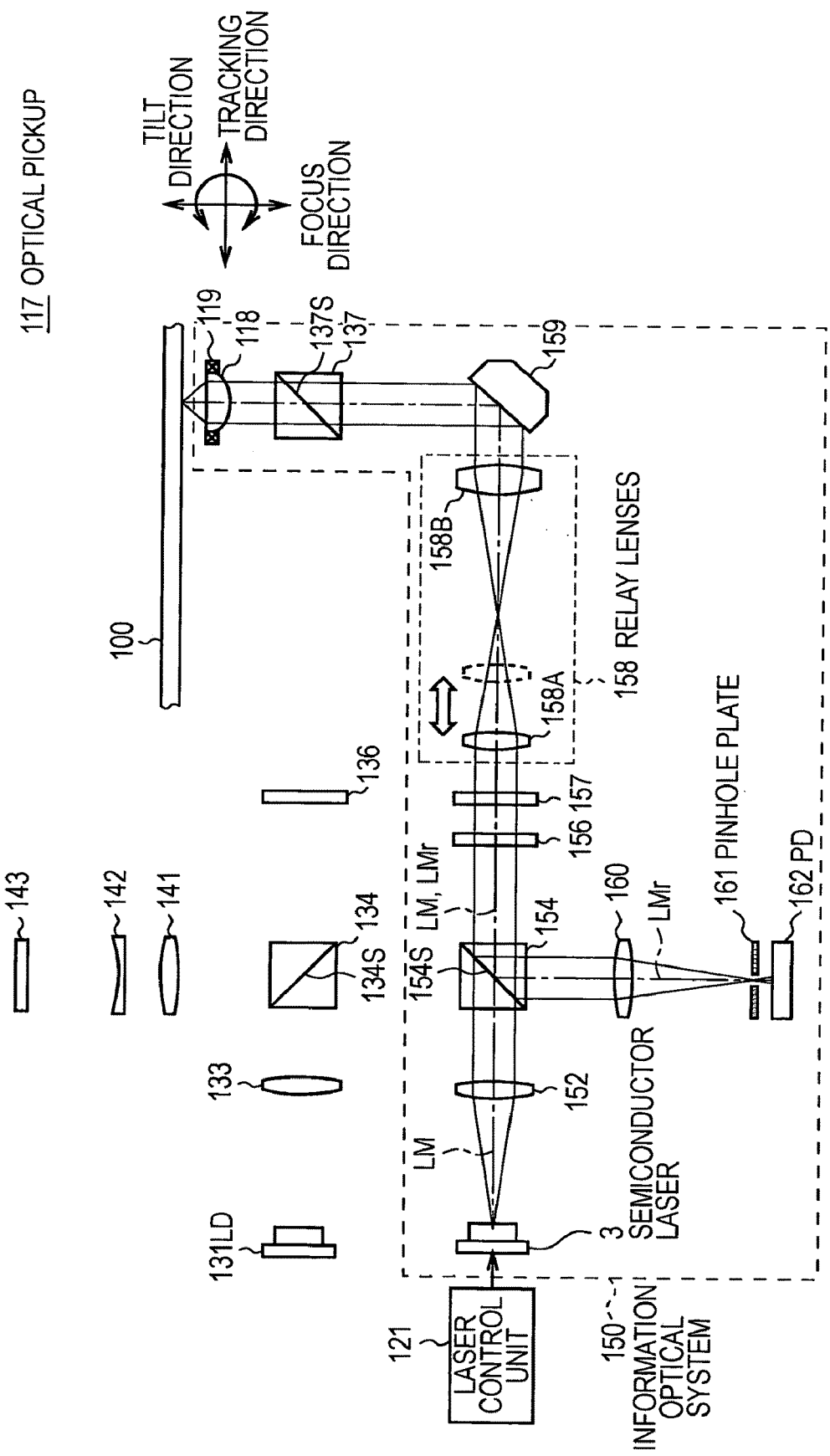
FIG. 36 is a schematic diagram illustrating an optical path of an information light beam.

On the other hand, in the information optical system 150, as illustrated in FIG. 36 corresponding to FIG. 34, the optical disc 100 is irradiated with an information light beam LM emitted from the semiconductor laser 3 via the objective lens 118, and a reflected information light beam LMr reflected by the optical disc 100 is received by a photodetector 162.

That is, the semiconductor laser 3 emits an information light beam LM, which is divergent light, on the basis of control performed by the control unit 111 (FIG. 33), and causes the light beam to enter a collimator lens 152. The collimator lens 152 transforms the information light beam LM from divergent light into parallel light and causes the light beam to enter a polarizing beam splitter 154.

The polarizing beam splitter 154 causes the information light beam LM, which is p-polarized light, to pass therethrough in its polarizing direction, and causes the light beam to enter a quarter-wavelength plate 157 via an LCP (Liquid Crystal Panel) 156 that corrects spherical aberration or the like.

The quarter-wavelength plate 157 transforms the information light beam LM from p-polarized light into circular polarized light and causes the light beam to enter relay lenses 158.

In the relay lenses 158, a movable lens 158A transforms the information light beam LM from parallel light into convergent light, and a fixed lens 158B transforms the information light beam LM, which becomes divergent light after convergence, into convergent light again, so that the convergent light enters a mirror 159.

The mirror 159 reflects the information light beam LM to deflect its travelling direction, and causes the light beam to enter the dichroic prism 137. The dichroic prism 137 causes the information light beam LM to pass therethrough, with the reflection/transmission surface 137S, and,causes the light beam to enter the objective lens 118.

The objective lens 118 focuses the information light beam LM to irradiate the optical disc 100 therewith. At this time, the information light beam LM passes through the substrate 102 and is focused into the recording layer 101, as illustrated in FIG. 32.

Here, the position of the focal point FM of the information light beam LM is determined by a convergence state at the time when the information light beam LM is emitted from the fixed lens 158B of the relay lenses 158. That is, the focal point FM moves in a focus direction in the recording layer 101 in accordance with the position of the movable lens 158A.

Actually, the information optical system 150 adjusts a depth "d" (i.e., the distance from the servo layer 104) of the focal point FM of the information light beam LM in the recording layer 101 of the optical disc 100 (FIG. 32), on the basis of control of the position of the movable lens 158A performed by the control unit 111 (FIG. 33), so that the focal point FM matches the target position PG.

As described above, in the information optical system 150, irradiation with an information light beam LM is performed via the objective lens 118 that is servo-controlled by the servo optical system 130, so that the tracking direction of the focal point FM of the information light beam LM matches a target position PG.

Then, the information light beam LM is focused onto the focal point FM by the objective lens 118, so that a recording mark RM can be formed at the target position PG.

On the other hand, in a case where a recording mark RM is recorded at a target position PG at a reproduction process of reading information recorded on the optical disc 100, an information light beam LM focused onto a focal point FM is reflected as a reflected information light beam LMr by the recording mark RM and enters the objective lens 118'.

On the other hand, in a case where a recording mark RM is not recorded at the target position PG, the information light beam LM passes through the optical disc 100, and thus a reflected information light beam LMr is hardly generated.

The objective lens 118 converges the reflected information light beam LMr to some extent and causes the light beam to enter the relay lenses 158 via the dichroic prism 137 and the mirror 159.

The relay lenses 158 transform the reflected information light beam LMr into parallel light and causes the light beam to enter the quarter-wavelength plate 157. The quarter-wavelength plate 157 transforms the reflected information light beam LMr, which is circular polarized light, into s-polarized light, and causes the light beam to enter the polarizing beam splitter 154 via the LCP 156.

The polarizing beam splitter 154 reflects, with a polarization surface 154S, the reflected information light beam LMr serving as s-polarized light, and causes the light beam to enter a multi lens 160. The multi lens 160 focuses the reflected information light beam LMr and irradiates the photodetector 162 with the light beam via a pinhole plate 161.

The pinhole plate 161 is placed so as to position the focal point of the reflected information light beam LMr focused by the multi lens 160 in a hole portion (not illustrated), and causes the reflected information light beam LMr to pass therethrough as is.

As a result, the photodetector 162 generates a detection signal SDb in accordance with the light amount of the reflected information light beam LMr without being affected by stray light, and supplies the signal to the signal processing unit 113 (FIG. 33).

The signal processing unit 113 performs a predetermined modulation process, decoding process, and the like on the detection signal SDb to generate reproduction information, and supplies the reproduction information to the control unit 111.

As described above, the information optical system 150 receives a reflected information light beam LMr that enters the objective lens 118 from the optical disc 100, and supplies a reception result thereof to the signal processing unit 113.

(3-3) Control of Emission Intervals (3-3-1) Configuration of Pulse Generator

Figure 37:
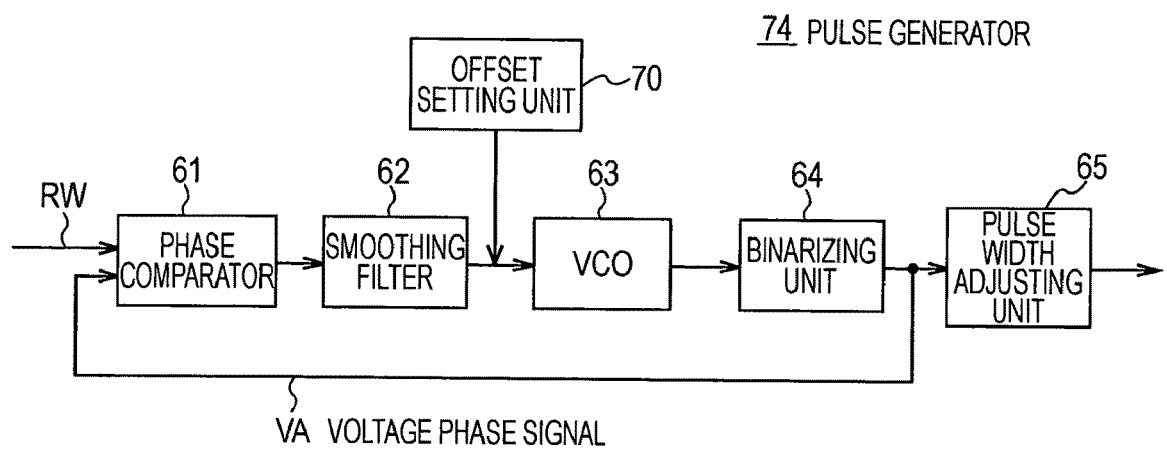
FIG. 37 is a schematic diagram illustrating a configuration of a pulse generator according to a third embodiment.

As illustrated in FIG. 37, the pulse generator 74 corresponding to the pulse generator 54 has an offset setting unit 70.

The offset setting unit 70 adds an offset voltage value to a VCO control voltage VC. The VCO 63 generates a frequency signal in accordance with the VCO control voltage VC added with the offset voltage value.

For example, in a case where the offset voltage value is a positive value, the VCO 63 increases the frequency of the frequency signal. As a result, the short-pulse light source 71 sets small voltage periods TV by advancing the rise of generated signal pulses SLw in a pulse signal SL, and can reduce the output periods TL of pulsed light accordingly. Likewise, in a case where the offset voltage value is a negative value, the VCO 63 can increase the output periods TL of pulsed light.

That is, the short-pulse light source 71 is configured to vary output periods TL from constant output periods TLa by an offset period ΔTr based on an offset voltage value OV.

In this way, the short-pulse light source 71 can adjust the output periods TL of pulsed light to arbitrary intervals in accordance with the setting of the offset voltage value OV.

(3-3-2) Recording Process

Next, an emission interval control process in a recording process will be described.

In a recording process, the optical disc device 110 causes specific output light LAp having a high emission intensity and serving as an information light beam LM to be emitted from the short-pulse light source 71, thereby forming a recording mark RM using two-photon absorption.

In this recording process, the short-pulse light source 71 desirably forms recording marks RM at predetermined intervals by emitting specific peaks APK at constant output periods TLa.

Thus, the control unit 111 (FIG. 33) sets an offset voltage value supplied from the offset setting unit 70 to "zero" during a recording process.

Accordingly, the optical disc device 110 can form recording marks RM at constant intervals on the basis of specific peaks APK that are output at constant output periods TLa.

In this way, the optical disc device 110 generates specific output light LAp at constant output periods TLa, thereby being able to form recording marks RM at constant intervals on a target track TG of the recording layer 101 of the optical disc 100.

(3-3-3) Reproduction Process

Next, an emission interval control process in a reproduction process will be described.

Incidentally, in a conventional optical disc device, irradiation with laser light LL is performed at a predetermined emission intensity, and a reproduction signal RF is generated on the basis of a reflected information light beam LMr reflected by a recording mark RM.

Figure 38:
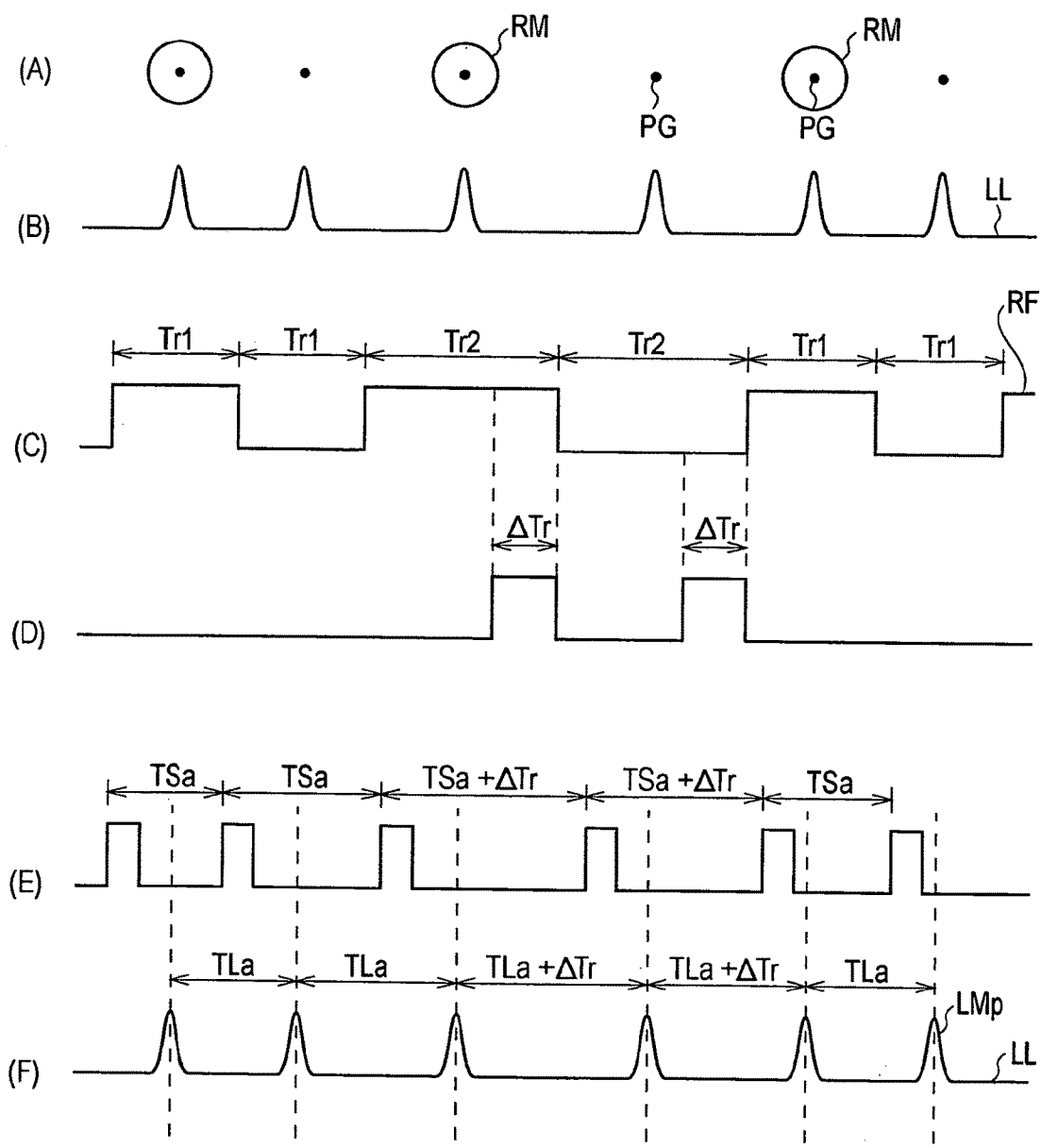
FIG. 38 is a schematic diagram for explaining offset setting in a reproduction process.

In the optical disc device 110 according to this embodiment, as illustrated in parts (A) and (B) of FIG. 38, a target position PG where it is possible that a recording mark RM is formed is irradiated with oscillation output light LMp having a relatively low light intensity as an information light beam LM for a relatively long emission time, whereby a reproduction signal RF is generated in a similar manner on the basis of a reflected information light beam LMr.

As described above, the optical disc device 110 records recording marks RM at constant intervals on the recording layer 101. However, due to insufficient accuracy of rotation speed of the spindle motor 115 or disturbance, for example, recording marks RM are not always recorded on the recording layer 101 at constant intervals. Also, the optical disc device 110 can not always rotate the optical disc 100 at constant speed due to insufficient accuracy of rotation speed during a reproduction process.

For this reason, the optical disc device 110 is configured to detect, as a reproduction period Tr, a period at which a recording mark RM is detected from a reproduction signal RF (part (C) of FIG. 38), and determine an output period TL of oscillation output light LMp on the basis of the difference between the detected reproduction period Tr and a reference reproduction period TrS serving as a reference. Note that, in the oscillation output light LMp, the interval between peaks of first waves is defined as an output period TL.

Actually, the signal processing unit 113 of the optical disc device 110 detects a reproduction period Tr from a reproduction signal RF and calculates a period difference ΔTr, which is the difference between the detected reproduction period Tr and the reference reproduction period TrS serving as a reference (part (D) of FIG. 38).

The signal processing unit 113 selects an offset voltage value OV corresponding to the period difference ΔTr from a table stored in advance, for example, and sets the offset voltage value OV to the offset setting unit 70.

The offset setting unit 70 can vary the frequency of a frequency signal in accordance with the offset voltage value OV by adding an offset to a VOC control voltage VC. As a result, the short-pulse light source 71 changes the set periods TS of generated signal pulses SLw of a pulse signal SL in accordance with the variation in frequency (part (E) of FIG. 38), and furthermore changes the voltage periods TV of a laser drive voltage DJ in accordance with the offset voltage value OV.

As a result, the short-pulse light source 71 can cause the semiconductor laser 3 to output oscillation output light LMp in a state where the output periods TL are staggered with respect to the constant output periods Ta by the period difference ΔTr (part (F) of FIG. 38).

Accordingly, the optical disc device 110 can substantially match the reproduction periods Tr and the output periods TL each other and thus can reliably irradiate recording marks RM with oscillation output light LMp.

In this way, the optical disc device 110 detects, as reproduction intervals Tr, the intervals at which recording marks RM are detected from the recording layer 101, and varies output periods TL in accordance with the reproduction periods Tr. Accordingly, the optical disc device 110 can reliably irradiate recording marks RM with information light beams LM (laser light LL) even in a case where the recording marks RM are not recorded at constant intervals.

(3-4) Operation and Effect

According to the above-described configuration, the short-pulse light source 71 adjusts voltage periods TV so as to vary output periods TL of oscillation output light LMp, which is pulse-shaped laser light.

Accordingly, the short-pulse light source 71 can freely vary the output periods TL according to applications.

Also, the short-pulse light source 71 detects an output period TL of oscillation output light LMp, and generates a VCO control voltage VC having a control voltage value based on a phase difference ΔW, which is the difference between a period of a voltage phase signal VA representing a voltage period TV of a laser drive voltage DJ that was generated immediately before and a period of an observation pulse train RW representing the output period TL. Also, the short-pulse light source 71 adds an offset voltage value OV to the VCO control voltage VC, generates a voltage phase signal VA having a frequency based on the value of the VCO control voltage VC added with the offset voltage value OV, and generates a laser drive voltage DJ on the basis of the voltage phase signal VA.

Accordingly, the short-pulse light source 71 can freely adjust the output period TL of pulsed light in accordance with the offset voltage value OV.

Also, the optical disc device 110 irradiates the optical disc 100 serving as an optical information recording medium with pulsed light. The optical disc device 110 forms a recording mark RM representing information by causing refractive-index modulation in the vicinity of the focal point of a specific peak APK in accordance with irradiation of the even recording layer 101 of the optical disc 100 with the specific peak APK. At this time, the optical disc device 110 irradiates, with specific output light LAp, the recording layer 101 containing a material for so-called nonlinear absorption, such as a two-photon absorbing material that simultaneously absorbs two photons with respect to the light amount of a specific peak APK.

Accordingly, the optical disc device 110 can quickly form a recording mark RM through irradiation with a specific peak APK having a high emission intensity.

Furthermore, the optical disc device 110 receives a reflected information light beam LMr serving as returned light that is generated when pulsed light is modulated by the optical disc 100, and generates a reproduction signal RF that varies in accordance with the presence/absence of a recording mark RM recorded on the optical disc 100 on the basis of the reflected information light beam LMr. The optical disc device 110 detects reproduction periods Tr at which recording marks RM are detected from the reproduction signal RF, and adjusts voltage periods TV so that the reproduction periods Tr and the output periods TL match each other.

Accordingly, even in a case where recording marks RM are not recorded at constant intervals or reproduction periods Tr vary due to low rotation accuracy of the spindle motor 115 during a reproduction process, the optical disc device 110 can irradiate a target position PG where it is possible that a recording mark RM is formed with pulsed light.

According to the above-described configuration, the short-pulse light source 71 can freely adjust output periods TL by varying voltage periods TV.

(4) Other Embodiments

Additionally, in the above-described second and third embodiments, a description has been given about a case of generating a pulse signal SL serving as a base of a laser drive voltage DJ on the basis of a phase difference ΔW. The present invention is not limited thereto. For example, ambient temperature may be measured and a pulse signal SL may be generated in accordance with the temperature.

Also, in the above-described second and third embodiments, a description has been given about a case where the maximum voltage value Vmax of a drive voltage pulse DJw is adjusted by setting the height Hs of the set pulse SLs. The present invention is not limited thereto, and the maximum voltage value Vmax may be adjusted by changing an amplification factor in the LD driver 5, for example.

Furthermore, in the above-described second and third embodiments, a description has been given about a case where zeroth order hold is performed on a rise of a voltage phase signal VA in an observation triangular wave. The present invention is not limited thereto, and first order hold may be performed. In this case, the smoothing filter 62 is unnecessary.

Furthermore, in the above-described second and third embodiments, a description has been given about a case where a rectangular pulse current is supplied as drive voltage pulses DJw. The present invention is not limited thereto. A point is that a pulse current having a large oscillation voltage value α may be supplied for a short time. For example, sinusoidal drive voltage pulses DJw may be supplied.

Furthermore, in the above-described second and third embodiments, a description has been given about a case where a typical semiconductor laser (e.g., SLD3233 made by Sony Corporation) is used as the semiconductor laser 3. The present invention is not limited thereto. A point is that a so-called semiconductor laser that performs laser oscillation using p-type and n-type semiconductors may be used. More preferably, a semiconductor laser that is intentionally configured to easily cause significant relaxation oscillation is used.

Furthermore, in the above-described second and third embodiments, a description has been given about a case where laser light LL emitted from the semiconductor laser 3 is switched between oscillation output light LMp and specific output light LAp. The present invention is not limited thereto. For example, normal output light LNp may be added as a switching target.

Furthermore, in the above-described third embodiment, a description has been given about a case where the recording layer 101 contains a two-photon absorbing material for nonlinear absorption. The present invention is not limited thereto, and nanoparticles of silver or gold that cause plasmon resonance may be used, for example, as a material for nonlinear absorption. Also, the recording layer on which a recording mark RM is to be formed may be irradiated with an information light beam LM in accordance with a cumulative amount of light energy.

Furthermore, although it is not particularly described in the above-described third embodiment, a recording mark RM having a mark length of 2T to 11T may be formed, and "1" and "0" may be assigned to a 1T mark to record information in accordance with the presence/absence of a recording mark RM. Furthermore, the correspondence between a recording mark RM (i.e., 1T) and oscillation output light LMp need not always be one to one, and a recording mark RM may be formed using two or more beams of oscillation output light LMp.

Furthermore, in the above-described second and third embodiments, a description has been given about a case where servo control is executed using the servo layer 104. The present invention is not limited thereto. For example, a servo mark for servo control may be formed in the recording layer 101 in advance, and servo control may be executed using the servo mark. In this case, the servo layer 104 is unnecessary in the optical disc 100.

Furthermore, in the above-described second and third embodiments, a description has been given about a case where a recording mark RM which is hollow is formed. The present invention is not limited thereto. For example, a recording mark RM may be formed by locally changing a refractive index using a chemical reaction.

Furthermore, in the above-described second and third embodiments, a description has been given about a case where the laser control unit 121 is provided inside the optical pickup 117. The present invention is not limited thereto, and the laser control unit 121 may be provided outside the optical pickup 117.

Furthermore, in the above-described second and third embodiments, a description has been given about a case where irradiation with an information light beam LM is performed from the surface on the substrate 102 side of the optical disc 100. The present invention is not limited thereto. For example, irradiation with an information light beam LM may be performed from either of surfaces, e.g., from the surface on the substrate 103 side, or from both surfaces. Note that a method for performing irradiation with an information light beam LM from both surfaces is described in Patent Document 2, for example.

Patent Document 2: Japanese Unexamined Patent Application Publication No. 2008-71433

Furthermore, in the above-described second and third embodiments, a description has been given about a case where the optical disc 100 is disc-shaped and is irradiated with an information light beam LM while being rotated. The present invention is not limited thereto, and may be applied to a case of recording information while moving an objective lens at a constant speed with respect to a rectangular-shaped optical information recording medium.

Furthermore, in the above-described second and third embodiments, the wavelength of an information light beam LM emitted from the semiconductor laser 3 may be a wavelength other than a wavelength of 404 [nm], as long as a recording mark RM can be appropriately formed in the vicinity of a target position PG in the recording layer 101.

Furthermore, in the above-described third embodiment, a description has been given about a case where the optical disc devices 110 and 110 are composed of an optical information recording/reproducing device for recording and reproducing information on/from the optical disc 100. The present invention is not limited thereto, and the optical disc device may be an optical information recording device for only recording information on the optical disc 100 or an optical information recording device for only reproducing information.

Furthermore, in the above-described third embodiment, a description has been given about a case where the short-pulse light source 1 is applied to the optical disc device 110. The present invention is not limited thereto, and can be applied to various devices, for example, various medical devices, thermal response microscopes, and the like.

Furthermore, in the above-described second embodiment, a description has been given about a case where the semiconductor laser 3 serving as a semiconductor laser and the laser control unit 52 serving as a laser control unit constitute the short-pulse light source 51 serving as a short-pulse light source. The present invention is not limited thereto, and a semiconductor laser and a laser control unit having other various configurations may constitute the short-pulse light source of the present invention.

Furthermore, in the above-described third embodiment, a description has been given about a case where the semiconductor laser 3 serving as a semiconductor laser, the objective lens 118 serving as a light irradiation unit, and the laser control unit 52 serving as a laser control unit constitute the optical disc device 110 serving as an optical disc device. The present invention is not limited thereto, and a semiconductor laser, a light irradiation unit, and a laser control unit having other various configurations may constitute the optical disc device of the present invention.

Industrial Applicability

The present invention can also be used in an optical information recording/reproducing device or the like for recording or reproducing large-volume information, such as video content and audio content, on/from a recording medium such as an optical disc.

Explanation of Reference Numerals

1 AND 120 . . . SHORT-PULSE LIGHT SOURCE, 2 AND 121 . . . LASER CONTROL UNIT, 3 . . . SEMICONDUCTOR LASER, 4 . . . PULSE GENERATOR, 5 . . . LD DRIVER, 100 . . . OPTICAL DISC, 110 . . . OPTICAL DISC DEVICE, 111 . . . CONTROL UNIT, 112 . . . DRIVE CONTROL UNIT, 113 . . . SIGNAL PROCESSING UNIT, 117 . . . OPTICAL PICKUP, 118 . . . OBJECTIVE LENS, 158 . . . RELAY LENSES, τd . . . EMISSION START TIME, DJ . . . LASER DRIVE VOLTAGE, DJw . . . DRIVE VOLTAGE PULSE, LL . . . LASER LIGHT, SL . . . PULSE SIGNAL, SLw . . . GENERATED SIGNAL PULSE, LMp . . . OSCILLATION OUTPUT LIGHT, LAp . . . SPECIFIC OUTPUT LIGHT, APK . . . SPECIFIC PEAK, ASP . . . SPECIFIC SLOPE, RM . . . RECORDING MARK, Tr, Tr1, AND Tr2 . . . REPRODUCTION PERIOD, TS AND TSa . . . SET PERIOD, TL . . . OUTPUT PERIOD, TV . . . VOLTAGE PERIOD, VA . . . VOLTAGE PHASE SIGNAL, VC . . . VCO CONTROL VOLTAGE, RW . . . OBSERVATION PULSE TRAIN

The invention claimed is:

1. A short-pulse light source comprising:
a semiconductor laser configured to emit pulse-shaped laser light,
a laser control unit configured to, when applying a laser drive voltage having pulse-shaped drive voltage pulses to the semiconductor laser, vary a voltage period corresponding to an interval between the pulse-shaped drive voltage pulses, and
wherein the laser control unit adjusts the voltage period so that an output period of the laser light is constant, and
wherein the laser control unit varies the voltage period to offset a variation in phase from when the pulse-shaped drive voltage pulses are started to be applied to when the pulse-shaped laser light is emitted.

2. The short-pulse light source according to claim 1, wherein the laser control unit includes
an output period detecting unit configured to detect an output period of the laser light, and
a voltage period varying unit configured to vary a first voltage period of a laser drive voltage that is newly generated based at least in part on a difference between a second voltage period of the laser drive voltage that was generated immediately before and the output period.

3. The short-pulse light source according to claim 2, wherein the output period detecting unit has a streak camera.

4. The short-pulse light source according to claim 2, wherein the voltage period varying unit includes
a voltage generating unit configured to generate a control voltage having a control voltage value based at least in part on the difference between the second voltage period of the laser drive voltage that was generated immediately before and the output period,
a voltage phase signal generating unit configured to generate a voltage phase signal having a frequency based on the control voltage value, and
a laser driver configured to generate a laser drive voltage based at least in part on the voltage phase signal.

5. A short-pulse light source, comprising:
a semiconductor laser configured to emit pulse-shaped laser light,
a laser control unit configured to, when applying a laser drive voltage having pulse-shaped drive voltage pulses to the semiconductor laser, vary a voltage period corresponding to an interval between the pulse-shaped drive voltage pulses,
wherein the laser control unit adjusts the voltage period to vary an output period of the laser light,
an output period detecting unit configured to detect the output period of the laser light,
a voltage value generating unit configured to generate a control voltage having a control voltage value based on a difference between a second voltage period of the laser drive voltage that was generated immediately before and the output period,
an offset adding unit configured to add an offset voltage value to the control voltage value,
a voltage phase signal generating unit configured to generate a voltage phase signal having a frequency based at least in part on the control voltage value added with the offset voltage value by the offset adding unit, and a laser driver configured to generate a laser drive voltage based at least in part on the voltage phase signal.

6. A short-pulse light source comprising:
a semiconductor laser configured to emit pulse-shaped laser light, and
a laser control unit configured to, when applying a laser drive voltage having pulse-shaped drive voltage pulses to the semiconductor laser, vary a voltage period corresponding to an interval between the pulse-shaped drive voltage pulses,
wherein the laser control unit causes specific output light having a pulse-shaped specific peak and a specific slope to be emitted as the laser light, an emission intensity of the specific slope being lower than an emission intensity of the specific peak.

7. An optical disc device comprising:
a semiconductor laser configured to emit pulse-shaped laser light;
an irradiation unit configured to irradiate an optical information recording medium with the laser light;
a laser control unit configured to, when applying a laser drive voltage having pulse-shaped drive voltage pulses to the semiconductor laser, vary a voltage period corresponding to an interval between the pulse-shaped drive voltage pulses;
a light receiving unit configured to receive returned light, which is the laser light modulated by the optical information recording medium;
a signal processing unit configured to generate a reproduction signal based at least in part on the returned light, the reproduction signal varying in accordance with presence/absence of a recording mark recorded on the optical information recording medium;
a reproduction period detecting unit configured to detect a reproduction period at which the recording mark is detected from the reproduction signal; and
wherein the laser control unit adjusts the voltage period so that the reproduction period and an output period match each other.

8. The optical disc device according to claim 7, wherein the light irradiation unit irradiates a recording layer with the laser light, the recording layer containing a material for nonlinear absorption with respect to an amount of the laser light.

9. The optical disc device according to claim 7, wherein the material for nonlinear absorption is a two-photon absorbing material that simultaneously absorbs two photons in the laser light.

10. The optical disc device according to claim 9, wherein the light irradiation unit forms a hollow by using irradiation with the laser light, thereby causing refractive-index modulation in a vicinity of a focal point of the laser light.

* * * * *